United States Patent
Nakano

(10) Patent No.: US 11,749,608 B2
(45) Date of Patent: Sep. 5, 2023

(54) DEVICE PACKAGES INCLUDING REDISTRIBUTION LAYERS WITH CARBON-BASED CONDUCTIVE ELEMENTS, AND METHODS OF FABRICATION

(71) Applicant: Micron Technology, Inc., Boise, ID (US)

(72) Inventor: Eiichi Nakano, Boise, ID (US)

( * ) Notice: Subject to any disclaimer, the term of this patent is extended or adjusted under 35 U.S.C. 154(b) by 0 days.

(21) Appl. No.: 17/076,602

(22) Filed: Oct. 21, 2020

(65) Prior Publication Data

US 2021/0057342 A1 Feb. 25, 2021

Related U.S. Application Data

(62) Division of application No. 16/236,681, filed on Dec. 31, 2018, now Pat. No. 10,854,549.

(51) Int. Cl.
*H01L 23/538* (2006.01)
*H01L 23/532* (2006.01)
*H01L 25/11* (2006.01)

(52) U.S. Cl.
CPC ...... *H01L 23/5384* (2013.01); *H01L 23/5385* (2013.01); *H01L 23/5386* (2013.01);
(Continued)

(58) Field of Classification Search
CPC ........... H01L 23/5384; H01L 23/53233; H01L 23/53261; H01L 23/53276; H01L 23/5385;
(Continued)

(56) References Cited

U.S. PATENT DOCUMENTS 7,105,930 B2 9/2006 Lua et al.
7,326,633 B2 2/2008 Chen
(Continued)

FOREIGN PATENT DOCUMENTS

CN 07-320543 A 12/1995
CN 1304281 A 7/2001
(Continued)

OTHER PUBLICATIONS

Kim et al., A Role for Graphene in Silicon-Based Semiconductor Devices, Nature, vol. 479, (Nov. 17, 2011), pp. 338-344.
(Continued)

*Primary Examiner* — Cuong B Nguyen
(74) *Attorney, Agent, or Firm* — TraskBritt

(57) ABSTRACT

Semiconductor device packages include a redistribution layer (RDL) with carbon-based conductive elements. The carbon-based material of the RDL may have low electrical resistivity and may be thin (e.g., less than about 0.2 μm). Adjacent passivation material may also be thin (e.g., less than about 0.2 μm). Methods for forming the semiconductor device packages include forming the carbon-based material (e.g., at high temperatures (e.g., at least about 550° C.)) on an initial support wafer with a sacrificial substrate. Later or separately, components of a device region of the package may be formed and then joined to the initial support wafer before the sacrificial substrate is removed to leave the carbon-based material joined to the device region.

20 Claims, 14 Drawing Sheets

(52) U.S. Cl.
CPC .. *H01L 23/53233* (2013.01); *H01L 23/53261* (2013.01); *H01L 23/53276* (2013.01); *H01L 25/117* (2013.01)

(58) Field of Classification Search
CPC . H01L 23/5386; H01L 25/117; H01L 23/481; H01L 25/18; H01L 23/525; H01L 23/49838; H01L 21/4846; H01L 21/4853; H01L 23/49811; H01L 23/49877
See application file for complete search history.

(56) References Cited

U.S. PATENT DOCUMENTS

| | | | |
|---|---|---|---|
| 7,470,416 | B2 | 12/2008 | Ishida |
| 8,097,947 | B2 | 1/2012 | Lua et al. |
| 8,178,201 | B2 | 5/2012 | Lee et al. |
| 8,586,871 | B2 | 11/2013 | Bernstein et al. |
| 8,969,154 | B2 | 3/2015 | Sandhu |
| 9,520,206 | B2 | 12/2016 | Ji et al. |
| 9,536,953 | B2 | 1/2017 | Elian et al. |
| 9,953,957 | B2 | 4/2018 | Gao et al. |
| 10,217,726 | B1 | 2/2019 | Nakano |
| 10,319,696 | B1 | 6/2019 | Nakano |
| 2006/0234056 | A1 | 10/2006 | Huang et al. |
| 2006/0243958 | A1 | 11/2006 | Suh et al. |
| 2007/0003472 | A1 | 1/2007 | Tolt |
| 2008/0087646 | A1 | 4/2008 | Liu et al. |
| 2009/0266590 | A1 | 10/2009 | Aoi |
| 2010/0051331 | A1 | 3/2010 | Tsai et al. |
| 2012/0080661 | A1* | 4/2012 | Saito ............... H01L 21/76879 257/29 |
| 2012/0236502 | A1 | 9/2012 | Yamaguchi et al. |
| 2015/0362266 | A1 | 12/2015 | Liu et al. |
| 2016/0276281 | A1* | 9/2016 | Sato .................. H01L 23/485 |
| 2018/0297849 | A1 | 10/2018 | Liu et al. |
| 2019/0051592 | A1 | 2/2019 | Kim et al. |
| 2019/0067253 | A1 | 2/2019 | Nakano |
| 2019/0172724 | A1 | 6/2019 | Nakano |
| 2019/0378781 | A1 | 12/2019 | Hedrick et al. |
| 2020/0006290 | A1 | 1/2020 | Chang et al. |
| 2020/0075532 | A1 | 3/2020 | Hotta et al. |
| 2020/0098621 | A1 | 3/2020 | Bharath et al. |

FOREIGN PATENT DOCUMENTS

| | | |
|---|---|---|
| CN | 2007-073388 A | 3/2007 |
| CN | 102197476 A | 9/2011 |
| CN | 102980917 A | 3/2013 |
| CN | 104143545 A | 11/2014 |

OTHER PUBLICATIONS

Liu et al., Anisotropic Conductive Films Based on Highly Aligned Polyimide Fibers Containing Hybrid Materials of Graphene Nanoribbons and Carbon Nanotubes, Nanoscale, vol. 7, No. 3, (Jan. 21, 2015), pp. 1037-1046 (abstract only).

Song et al., Highly Anisotropic Thermal Conductivity of Layer-by-Layer Assembled Nanofibrillated Cellulose/Graphene Nanosheets Hybrid Films for Thermal Management, ACS Appl. Mater. Interfaces, vol. 9, No. 3 (Jan. 3, 2017), pp. 2924-2932 (abstract only).

Chinese First Office Action for Chinese Application No. 201911391579. 8, dated Feb. 18, 2023, 10 pages with translation.

* cited by examiner

DEVICE PACKAGES INCLUDING REDISTRIBUTION LAYERS WITH CARBON-BASED CONDUCTIVE ELEMENTS, AND METHODS OF FABRICATION

CROSS-REFERENCE TO RELATED APPLICATION

This application is a divisional of U.S. patent application Ser. No. 16/236,681, filed Dec. 31, 2018, now U.S. Pat. No. 10,854,549, issued Dec. 1, 2020, the disclosure of which is hereby incorporated in its entirety herein by this reference.

TECHNICAL FIELD

The disclosure, in various embodiments, relates generally to redistribution layers, methods of fabrication, and semiconductor device packaging. More particularly, embodiments disclosed herein relate to redistribution layers comprising carbon-based conductive elements, methods for fabricating same, and related semiconductor device packages and systems.

BACKGROUND

As the electronics industry evolves and encompasses more and different applications (e.g., smart phones and other mobile devices, increasingly compact personal computers (e.g., laptops, tablets), artificial intelligence, the Internet of Things, and cloud computing), there is an ever-increasing demand for high density, small form factor modular packages comprising multiple semiconductor devices, such as in packages having stacked semiconductor dice. In such structures, form factor may be a significant consideration in designing mobile applications, among others, wherein significant form factor considerations include not only the footprint (e.g., length and width) of a package but also the height of the package.

Packages may include a redistribution layer (RDL) in which the contacts of semiconductor die are redistributed over a larger area. The RDL is typically defined by the addition and patterning of metal materials (e.g., in the form of conductive traces and/or vias) and dielectric materials (e.g., passivation materials) onto the surface of a substrate to re-route an Input/Output (I/O) layout into a looser pitch footprint. Such redistribution may typically use metal materials (e.g., aluminum or copper) to reroute peripheral pads to an area array configuration. To achieve effective electrical conductivity and to compensate for resistivity of the metal materials, the metal materials of the conductive traces and vias are often several micrometers in thickness, as are the adjacent dielectric materials. Designing and fabricating the RDL of a package with small height form factors that still effectively conduct electricity for redistribution continues to present challenges.

BRIEF DESCRIPTION OF THE DRAWINGS

FIGS. 16 through 20, in conjunction with FIGS. 4 and 6, are cross-sectional, elevational, schematic illustrations during various stages of processing to fabricate a semiconductor device package according to an embodiment of the disclosure, wherein FIG. 16 illustrates a stage following that of FIG. 6.

FIGS. 21 and 22, in conjunction with FIGS. 4 through 15, are cross-sectional, elevational, schematic illustrations during various stages of processing to fabricate a semiconductor device package according to an embodiment of the disclosure, wherein FIG. 21 illustrates a stage following that of FIG. 15.

FIGS. 23 through 25, in conjunction with FIGS. 4, 6 and 16 through 18, are cross-sectional, elevational, schematic illustrations during various stages of processing to fabricate a semiconductor device package according to an embodiment of the disclosure, wherein FIG. 23 illustrates a stage following that of FIG. 18.

DETAILED DESCRIPTION

Figure 1:
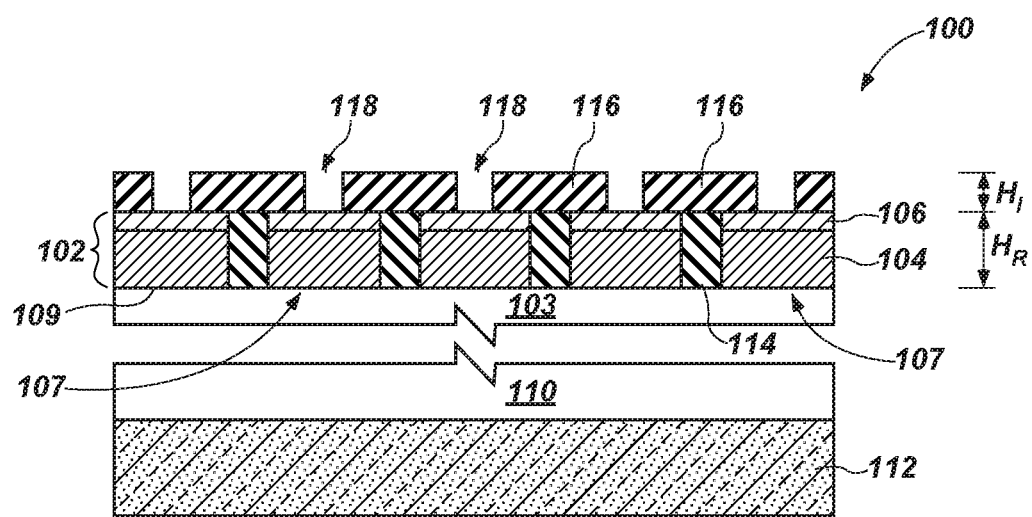
FIG. 1 is a cross-sectional, elevational, schematic illustration of a semiconductor device package according to an embodiment of the disclosure.

Semiconductor device packages and methods of fabrication therefore are disclosed in which the packages include a redistribution layer (RDL) comprising carbon-based conductors (e.g., carbon-based conductive elements). The carbon-based material of the redistribution layer may exhibit extremely low electrical resistivity, enabling the redistribution layer to effectively transmit power, ground, and data signals at fast rates even when only a thin (e.g., of a relatively small vertical height) region of the carbon-based material is present. The thinness of the redistribution layer may also enable surrounding insulative regions (e.g., regions of interdielectric material, regions of passivation material) to be thin and still function as insulators. That is, with a thin redistribution layer, good coverage (e.g., good "step coverage" (e.g., uniform coverage)) of the material of the redistribution layer by surrounding insulative material may be more reliably achieved with a lesser amount (e.g., thickness) of the insulative material than needed for a thicker redistribution layer. For example, lower thicknesses of the redistribution layer may enable a lesser amount of a passivation material to ensure adequate coverage of the sidewalls of the structures of the redistribution layer. Thus, a thinner redistribution layer may enable a thinner surrounding insulative region to achieve sufficient coverage and insulation. Also, the carbon-based material may be formed, with a high temperature formation process, on a substrate separate from a wafer on which other semiconductor device components are formed. Thus, the high temperature process for forming the carbon-based material may not detrimentally impact the fabrication of the other semiconductor device components. The resulting semiconductor device packages exhibit a very low height form factor, enabling improved scaling in three-dimensional stacks that include such packages.

As used herein, the term "redistribution layer" means and includes a region comprising conductive elements and placed on a surface of a semiconductor die bearing bond pads or other terminals, which region enables component-to-component electrical connections at select, laterally offset locations of the semiconductor die and another component. A redistribution layer (RDL) may comprise at least one conductive region (e.g. (e.g., a single layer of conductive traces, or multiple layers interconnected vertically) and at least one region of insulative (e.g., passivation) material adjacent the conductive material.

As used herein, the term "carbon-based," when referring to a material, means and includes a material comprising at least 50 at. % carbon, consisting essentially of carbon or a carbon allotrope, or consisting of carbon or a carbon allotrope. "Carbon-based" materials include, but are not necessarily limited to, the carbon allotropes of graphene, carbon nanotubes, carbon nanobuds, and carbon nanoribbons.

As used herein, the term "low resistivity," when referring to an exhibited property of a material, refers to an electrical resistance or electrical resistivity on the order of about $10^{-6}$ $\Omega \cdot cm$ or less.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "wafer" means and includes not only a conventional, substantially circular wafer of a single material (e.g., a single crystal silicon), but also other bulk substrates in the form of a silicon-on-insulator (SOI) structure, as well as bulk substrates comprising other materials (e.g., semiconductor materials (e.g., germanium, gallium arsenide)), as well as substrates employed in fabrication of structures thereon, such as RDLs, which substrates may comprise other materials such as glasses or ceramics, in addition to the foregoing.

As used herein, the terms "layer" and "film" mean and include a level, sheet, or coating of material residing on a structure, which level, sheet, or coating may be continuous or discontinuous between portions of the material, may be planar or non-planar, and may be conformal or non-conformal, unless otherwise indicated.

As used herein, the term "sacrificial," when referring to a material, region, structure, or component, means and includes the material, region, structure, or component being of a preliminary or intermediary stage in a fabrication process and intended for removal, in whole or in substantial part, prior to completion of the fabrication process.

As used herein, the terms "lateral" or "horizontal" mean and include a direction that is parallel to a primary surface of the substrate on which the referenced material or structure is located. The width and length of a respective region or material may be defined as dimensions in a horizontal plane.

As used herein, the terms "longitudinal" or "vertical" mean and include a direction that is perpendicular to a primary surface of the substrate on which a referenced material or structure is located. The height of a respective region or material may be defined as a dimension in a vertical plane.

As used herein, the terms "thickness," "thinness," or "height" mean and include a dimension in a straight-line direction that is normal to the closest surface of an immediately adjacent material or region of different composition.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent to, directly adjacent to, and internal to.

As used herein, the term "neighboring," when referring to a material or region, means and refers to a next, most proximate material or region of an identified composition. Materials or regions of other compositions than the identified composition may be disposed between one material or region and its "neighboring" material or region of the identified composition. For example, a region of passivation material "neighboring" a region of conductive material is the passivation material region, e.g., of a plurality of passivation material regions, that is next most proximate to the particular region of conductive material. The "neighboring" material or region may be directly or indirectly proximate the region or material of the identified composition.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly or apparatus in a predetermined way.

The illustrations presented herein are not meant to be actual views of any particular component, device, or system, but are merely idealized representations that are employed to describe embodiments of the disclosure.

The following description provides specific details—such as material types, material thicknesses, and processing conditions—in order to provide a thorough description of embodiments of the disclosed packages, methods, and systems. However, a person of ordinary skill in the art will understand that the embodiments of the packages, methods, and systems may be practiced without employing these specific details. Indeed, the embodiments of the packages, methods, and systems may be practiced in conjunction with conventional semiconductor fabrication techniques employed in the industry.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization (e.g., grinding or chemical mechanical planarization (CMP)), or other known methods.

The fabrication processes described herein do not form a complete process flow for processing semiconductor device structures. The remainder of the process flow, whether stages preceding or following those described, is known to those of ordinary skill in the art. Accordingly, only the methods and semiconductor device structures necessary to understand embodiments of the present structures, assemblies, systems, and methods are described herein.

Reference will now be made to the drawings, where like numerals refer to like components throughout. The drawings are not necessarily drawn to scale.

FIG. 1 illustrates a semiconductor device package 100 according to an embodiment of the disclosure. The semiconductor device package 100 includes a redistribution layer 102 (RDL) that includes a conductive carbon-based material 104 having low resistivity. Optionally, another conductive material (a "seed material" 106) may be above the carbon-based material 104.

In some embodiments, the conductive carbon-based material 104 may be configured as conductive traces or vias that may be in electrical connection with circuitry of a semiconductor die (e.g., with circuitry of an upper device region 103 of the die) to other conductive components, e.g., through openings 118 into which under bump metallization (UBM) for connection of solder bumps, or other external conductive elements (not shown) may be disposed for the component-to-component connections.

In some embodiments, the carbon-based material 104 may consist essentially of or consist of graphene with an electrical resistivity of about $10^{-6}$ $\Omega \cdot$cm. This low electrical resistivity may be exhibited regardless of the width or thickness of the region of the carbon-based material 104. If present, the seed material 106 may comprise, consist essentially of, or consist of nickel (Ni), a bi-layer of copper (Cu) and nickel (Ni), or another conductive material formulated for growth of the carbon-based material (e.g., the graphene) thereon.

With such low resistivity, the carbon-based material 104 may be formed to be thin (e.g., to define, with the seed material 106 (if present) a low vertical height $H_R$). For example, the carbon-based material 104 (alone or in combination with the seed material 106) may define a height $H_R$ (and, therefore, the RDL 102 may define the height $H_R$) of less than about 2000 Å (less than about 0.2 μm) (e.g., less than about 1000 Å (less than about 0.1 μm), less than about 500 Å (less than about 0.05 μm)). The height $H_R$ may be defined entirely or primarily (e.g., at least 50%) by the carbon-based material 104. If present, the seed material 106 may be thinner (e.g., define a lesser vertical height) than the carbon-based material 104.

The conductive materials (e.g., the carbon-based material 104 and, if present, the seed material 106) may be formed as discrete, electrically conductive elements 107 (e.g., conductive traces, conductive vias) in contact with a surface 109 of the semiconductor die (e.g., the surface 109 of the upper device region 103 of the semiconductor die). A lower device region 110, which may be supported by a substrate 112, may be between the substrate 112 and the upper device region 103, below the RDL 102.

Space between the conductive elements 107 may be filled with a passivation material 114. Another passivation material 116 may overlay the passivation material 114 and the conductive elements 107 of the carbon-based material 104 and (if present) the seed material 106, with access to the conductive elements 107 provided by the openings 118 in the other passivation material 116. The passivation materials 114, 116 may each or both comprise, consist essentially of, or consist of an electrically insulative material such as a nitride (e.g., silicon nitride ($Si_3N_4$), silicon oxynitride ($Si_xO_yN_y$), silicon carbonitride (SiCN)). In some embodiments, the passivation material 114 and the other passivation material 116 may have the same chemical composition. In other embodiments, they may have different chemical compositions.

Because the conductive material (e.g., the carbon-based material 104 and (if present) the seed material 106) of the conductive elements 107 defines a low height $H_R$, the passivation material 114 between the conductive elements 107 also defines the low height $H_R$. And, because the RDL 102 comprises primarily the carbon-based material 104 with low resistivity, the other passivation material 116 above the RDL 102 materials may also be thin (e.g., define a low vertical height $H_1$) and still exhibit sufficient electrical insulative properties. In some embodiments, the other passivation material 116 may define a height $H_1$ of less than about 2000 Å (less than about 0.2 μm) (e.g., less than about 1000 Å (less than about 0.1 μm), less than about 500 Å (less than about 0.05 μm)).

Because both the height $H_R$ of the conductive elements 107 (e.g., conductive traces, conductive vias) and the height $H_1$ of the other passivation material 116 are less than 0.2 μm each, the semiconductor device package 100 may be significantly thinner than if these conductive elements 107 of the RDL 102 included a conductive material having higher electrical resistivity, such as aluminum (Al), at a thickness on the order of perhaps 3 μm to 5 μm topped with a passivation material of similar thickness. The use of the carbon-based material 104 with low resistivity may enable a significant height form factor savings, which accommodates vertical scaling in three-dimensional stacking of semiconductor device structures.

Figure 2:
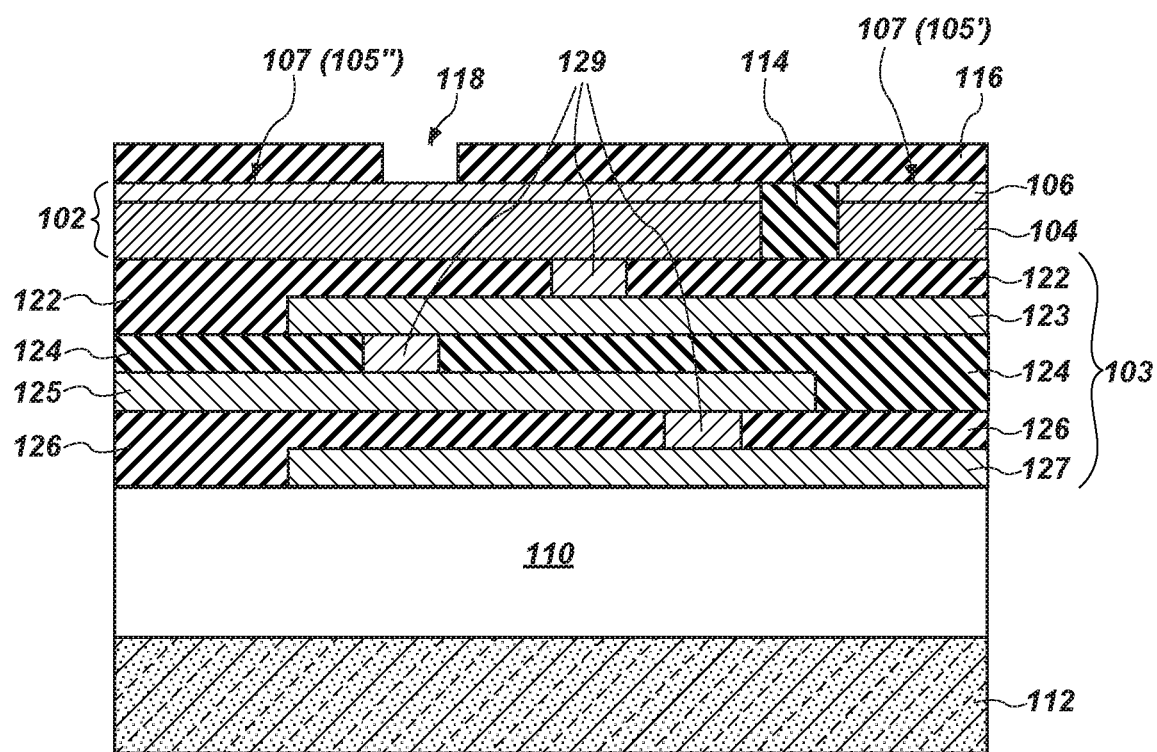
FIG. 2 is an enlarged and more detailed schematic illustration of a portion of the semiconductor device package of FIG. 1.

While the upper device region 103 of FIG. 1 is illustrated without detail, FIG. 2 illustrates an enlargement. The upper device region 103 may include interdielectric materials 122, 124, 126 (e.g., insulative materials), interleaved with and adjacent to conductive materials (e.g., metals) 123, 125, 127 electrically connected by conductive plugs 129.

Adjacent the upper device region 103 of the semiconductor die may be the lower device region 110, which may include active circuitry for a semiconductor device (e.g., a semiconductor memory device). For example, memory circuitry in the form of dynamic random access memory (DRAM) circuitry or NAND flash memory circuitry may be included. The active circuitry is in electrical communication with external conductive elements through electrically conductive materials (e.g., materials 123, 125, 127), including the carbon-based material 104 configured as vias 105' and conductive traces 105" in the aforementioned portion of the RDL 102.

Figure 3:
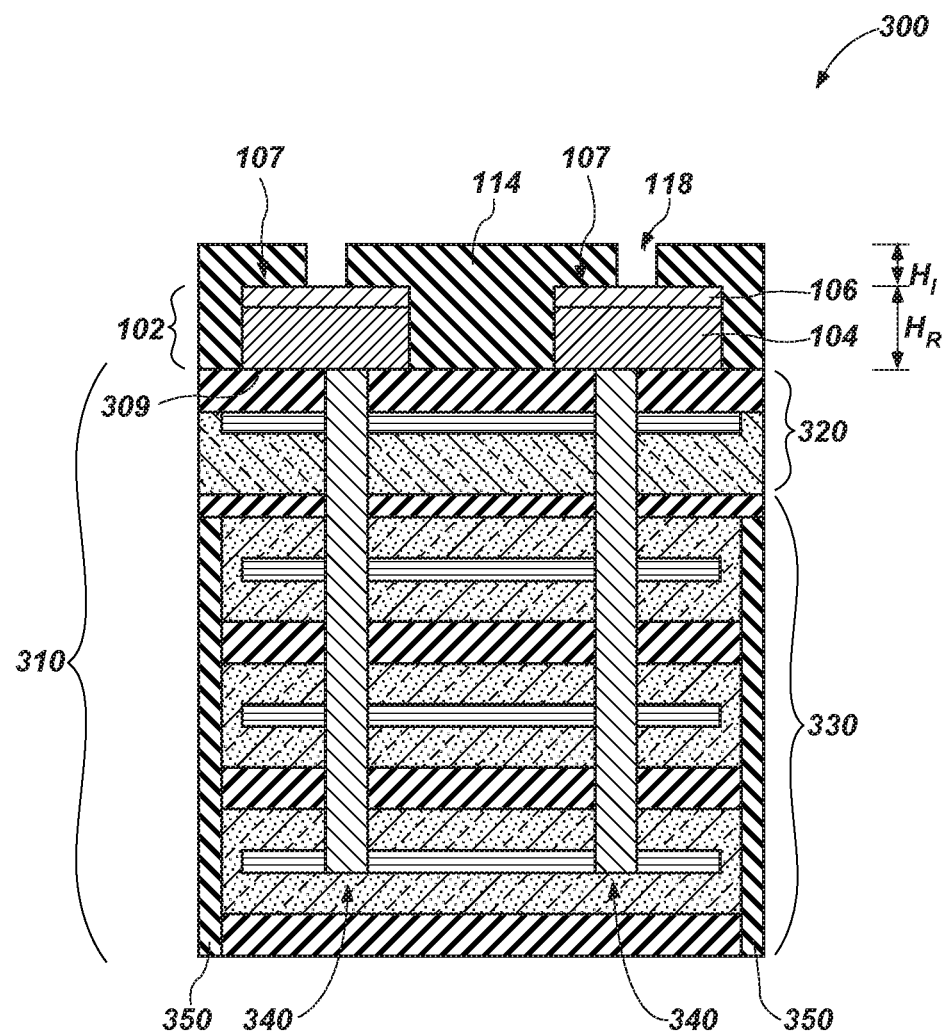
FIG. 3 is a cross-sectional, elevational, schematic illustration of a singulated semiconductor device package according to an embodiment of the disclosure.

With reference to FIG. 3, another embodiment for a semiconductor device package 300 is illustrated. As with the semiconductor device package 100 of FIG. 1, the semiconductor device package 300 may include redistribution layer 102 with discrete structures providing conductive elements 107 that include the carbon-based material 104 and, optionally, the seed material 106. As noted above, the electrically conductive, carbon-based material 104 may be configured as vias and conductive traces, and the conductive elements 107 may be in electrical connection with other components by conductive material contacting the conductive elements 107 through openings 118 in the passivation material 114 that may extend between and overlay the discrete elements 107 to define the height $H_1$ above the RDL 102.

The conductive elements 107 and the passivation material 114 of the RDL 102 may be in contact with a surface 309 of a device region 310, with the device region 310 including a stacked die structure (e.g., a three-dimensional (3D) stack of semiconductor dice). An upper die 320 of the device region 310 may include a logic die while lower dice 330 of the device region 310 may include multiple DRAM dice. The die of the upper portion 320 may alternatively be referred to as a "controller" die, and the dice of the lower portion 330 may be referred to as "memory" dice when the device region 310 is characterized as having a master-slave type of architecture. Vias 340 (e.g., through-silicon-vias (TSVs)) and conductive pillars between the TSVs of the various dice may extend through the upper die 320 and the lower dice 330 of the device region 310 and contact the conductive elements 107 of carbon-based material 104 of the RDL 102. The sides of the lower dice 330 may be bordered by a dielectric molding compound 350, and the semiconductor device package 300 may be referred to as a "singulated cube."

As with the semiconductor device package 100 of FIG. 1, the semiconductor device package 300 of FIG. 3 may exhibit improved height form factor due to the thinness of the conductive elements 107 in the RDL 102 and the passivation material 114, enabled by the use of the carbon-based material 104 with low resistivity.

While the structures of FIGS. 1 through 3 illustrate one elevation of the RDL 102 comprising the carbon-based material 104, in other embodiments, multiple elevations within the RDL 102 may include the carbon-based material 104, each of which may exhibit the thinness of the low height $H_R$ and benefit from the improved height form factor due to the low resistivity of the carbon-based material 104.

Accordingly, disclosed is a semiconductor device package comprising a redistribution layer including conductive elements comprising a conductive carbon-based material. The conductive elements of the redistribution layer define a vertical height of less than about 0.2 μm. A passivation material is above the conductive elements of the redistribution layer and defines another vertical height of less than about 0.2 μm. A device region of a semiconductor die comprising circuitry is connected to the conductive elements of the redistribution layer.

The semiconductor device packages of the disclosure (e.g., semiconductor device package 100 of FIGS. 1 and 2, semiconductor device package 300 of FIG. 3) may be fabricated by methods that form the carbon-based material 104 with a high-temperature formation process. As used herein, the term "high temperature" means and refers to temperatures exceeding 550° C. For example, the carbon-based material 104 may be graphene formed at high temperatures. Such high temperatures may be needed to sufficiently form the graphene. Even so, by the disclosed methods, the high temperatures for forming the graphene (or other carbon-based material 104) may not risk damage to components or materials of the device regions 103, 110 (FIGS. 1 and 2), 310 (FIG. 3) because the components and materials of the device regions 103, 110, 310 may be formed separately from (e.g., on a separate supportive wafer) or subsequently to formation of the graphene (or other carbon-based material 104). For example, and as discussed further below, the carbon-based material 104 may be formed at a high temperature on a sacrificial substrate of an initial support wafer before, after, or while materials of the device regions 103, 110, 310 are formed on a device wafer. The initial support wafer and its carbon-based material 104 may be joined to the device wafer, and then sacrificial materials of the initial support wafer removed to leave the carbon-based material 104 supported on the device regions 103, 110, 310 of the device wafer.

Accordingly, disclosed is a redistribution layer comprising at least one level of conductive elements comprising a carbon-based material. The conductive elements of a level of the at least one level define a height of less than about 0.2 μm. The redistribution layer also includes a passivation material about the conductive elements. The conductive elements are accessible through the passivation material to other conductive materials.

Figure 4:
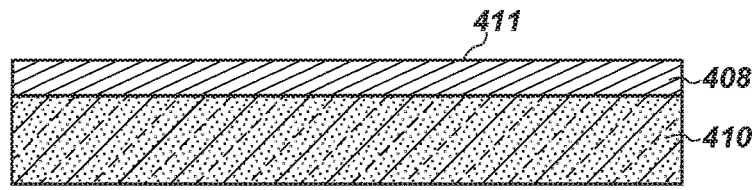
FIGS. 4 through 15 are cross-sectional, elevational, schematic illustrations during various stages of processing to fabricate the semiconductor device package of FIGS. 1 and 2, according to embodiments of the disclosure, wherein the stages of the illustrations of FIGS. 6 through 8 follow that of FIG. 4 and precede that of FIG. 5 according to an embodiment of the disclosure, and wherein the stages of the illustrations of FIGS. 9 through 11 follow that of FIG. 4 and precede that of FIG. 5 according to another embodiment of the disclosure.

With reference to FIGS. 4 through 15, illustrated are stages of a method of fabricating the semiconductor device package 100 of FIGS. 1 and 2. With reference to FIG. 4, a sacrificial base material 408 may be formed (e.g., by CVD) over a sacrificial substrate 410 of an initial support wafer. The sacrificial base material 408 may comprise, consist essentially of, or consist of a dielectric material (e.g., silicon dioxide ($SiO_2$), silicon nitride ($Si_3N_4$), silicon carbonitride (SiCN), silicon-carbon-oxygen (SiCO)). The sacrificial substrate 410 may comprise, consist essentially of, or consist of silicon (e.g., monocrystalline silicon, polysilicon) or any another material capable of supporting the sacrificial base material 408 during subsequent processing.

Figure 5:
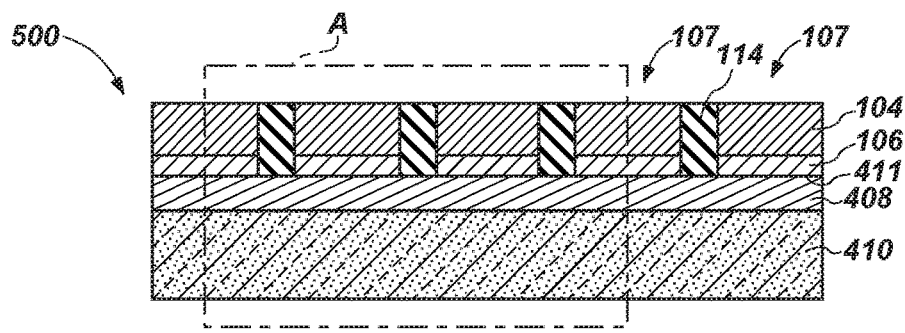

The sacrificial base material 408 may exhibit a continuous surface 411 upon which the discrete structures for the conductive elements 107 and intervening passivation material 114 may be formed to fabricate an initial support wafer 500, illustrated in FIG. 5. As initially formed, the conductive elements 107 are inverted from their final orientation, such that they have the seed material 106 below the carbon-based material 104.

Figure 6:
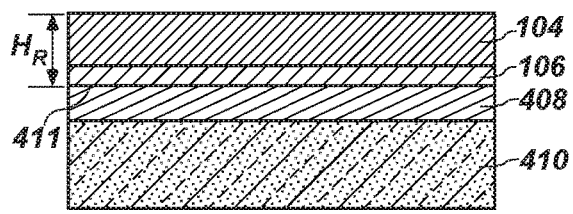
Figure 7:
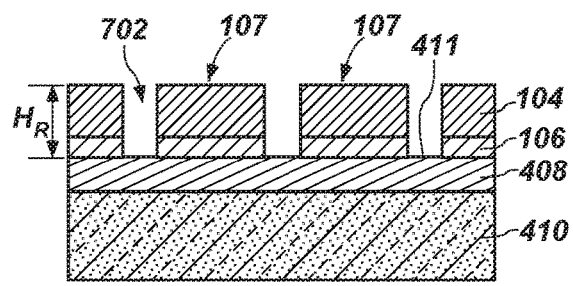
Figure 8:
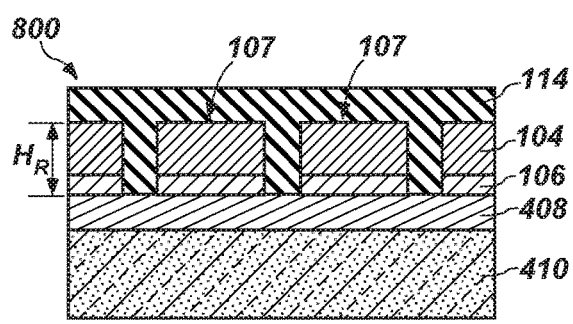

In some embodiments, the initial support wafer 500 (FIG. 5) may be fabricated by forming and patterning the seed material 106 and the carbon-based material 104 before forming the passivation material 114, as illustrated in FIGS. 6 through 8, which show additional processing stages in the portion of the initial support wafer 500 indicated by box A.

With reference to FIG. 6, the seed material 106 may be formed (e.g., by PVD, by CVD, by plating) on the surface 411 of the sacrificial base material 408. Thus, the sacrificial base material 408 may be formulated and configured to provide a sufficient surface structure (e.g., a smooth, continuous structure) upon which to form the seed material 106. The carbon-based material 104 may be formed (e.g., by microwave plasma CVD (MPCVD), by high-temperature CVD, by plasma CVD, by magnetron CVD, by plasma-enhanced CVD) on the seed material 106 to define thickness $H_R$. The formation may be conducted at high temperatures to enable forming the carbon-based material 104 (e.g., graphene), with the underlying seed material 106 used to enable the carbon-based material 104 to adhere to the structure as the material forms. In other embodiments, the sacrificial base material 408 may incorporate or be formulated to serve as a seed material for the formation of the carbon-based material 104. So, in these embodiments, a separate seed material 106 may be omitted, and the carbon-based material 104 may be formed directly on the sacrificial base material 108.

With reference to FIG. 7, the carbon-based material 104 and the seed material 106 may be patterned (e.g., by photolithography and etching (e.g., dry etching, wet etching)) to remove select portions of the materials 104, 106 and define the discrete structures for the conductive elements 107 and openings 702 in which select areas of the surface 411 of the sacrificial base material 408 are exposed. For example, in embodiments in which the carbon-based material 104 is graphene, it may be patterned by plasma dry etching, and then underlying portions of the seed material 106 may be removed by chlorine-based etching. In some embodiments, some portions of the underlying sacrificial base material 408 may also be removed to form the openings 702. The openings 702 may define widths of less than one micrometer (less than 1 μm), and the thinness of the carbon-based material 104 and the seed material 106 may accommodate forming the openings 702 without difficulties normally associated with etching through thicker materials (e.g., complex masking materials, sloping sidewalls, collapsing structures).

With reference to FIG. 8, the openings 702 (FIG. 7) may then be filled by forming (e.g., by CVD) the passivation material 114 therein and, optionally, above the conductive elements 107, as shown in structure 800 illustrated in FIG. 8. In embodiments in which the passivation material 114 is formed to overlay the conductive elements 107, the structure 800 may then be subjected to planarization (e.g., CMP) to expose the conductive elements 107 through the passivation material 114, as in the structure of the initial support wafer 500 of FIG. 5.

Figure 9:
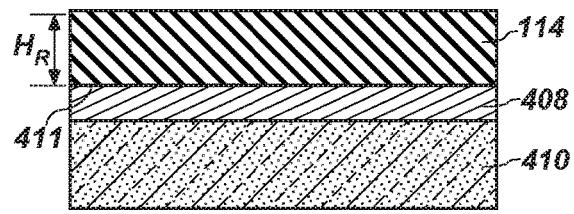
Figure 10:
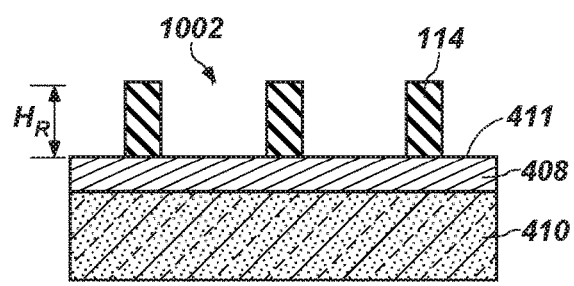
Figure 11:
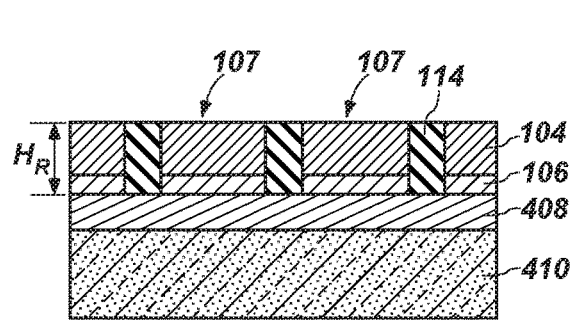

In other embodiments, the structure of the initial support wafer 500 (FIG. 5) may be formed by first forming and patterning the passivation material 114 and then forming the discrete structures for the conductive elements 107 of the carbon-based material 104 and the seed material 106 therein, as illustrated in FIGS. 9 through 11, which show additional processing stages in the portion of the initial support wafer 500 indicated by box A. For example, the passivation material 114 may be formed to a thickness of $H_R$, as illustrated in FIG. 9; patterned to form openings 1002 exposing areas of the surface 411 of the sacrificial base material 408, as illustrated in FIG. 10; and then, as illustrated in FIG. 11, the seed material 106 and the carbon-based material 104 may be sequentially formed in the openings 1002 (FIG. 10) to form the discrete structures for the conductive elements 107 exhibiting the low thickness $H_R$ and resulting in the initial support wafer 500 of FIG. 5.

Figure 12:
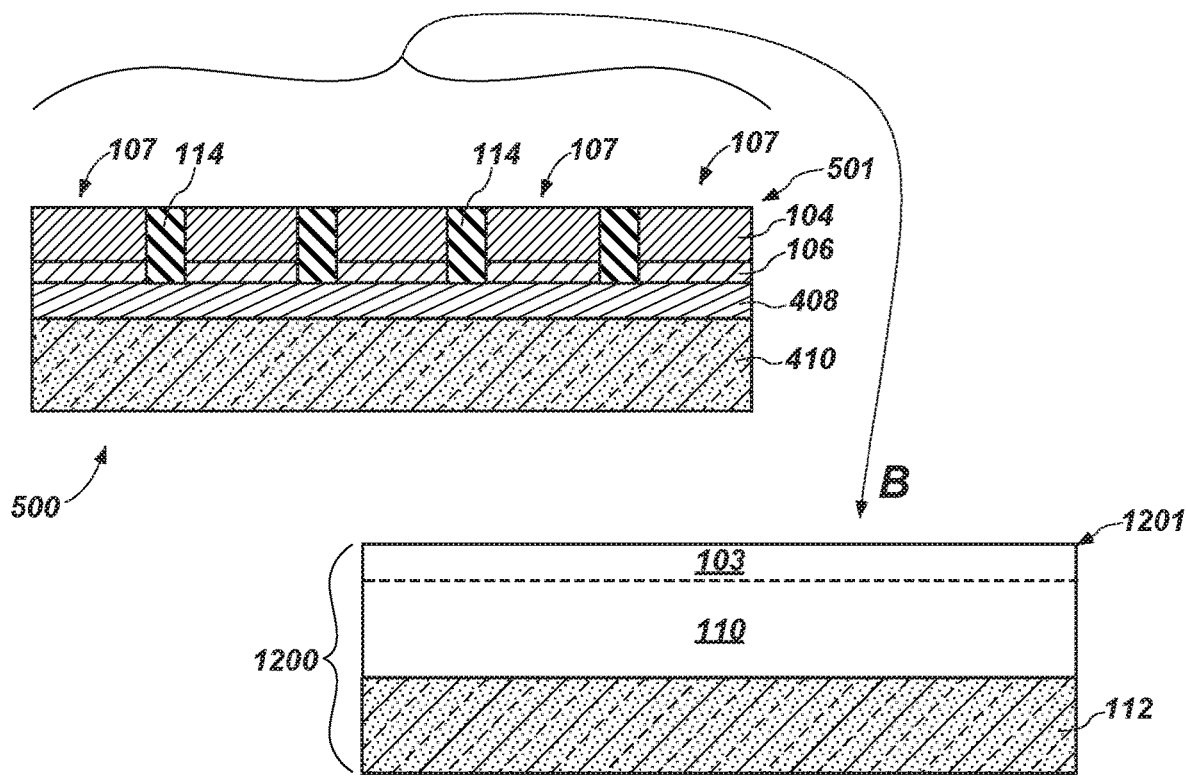
Figure 13:
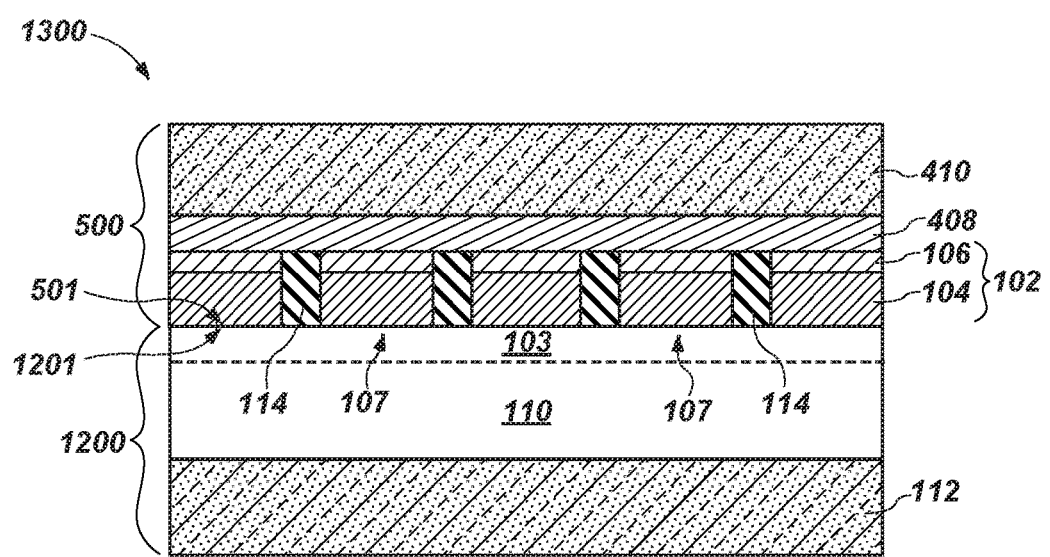
Figure 14:
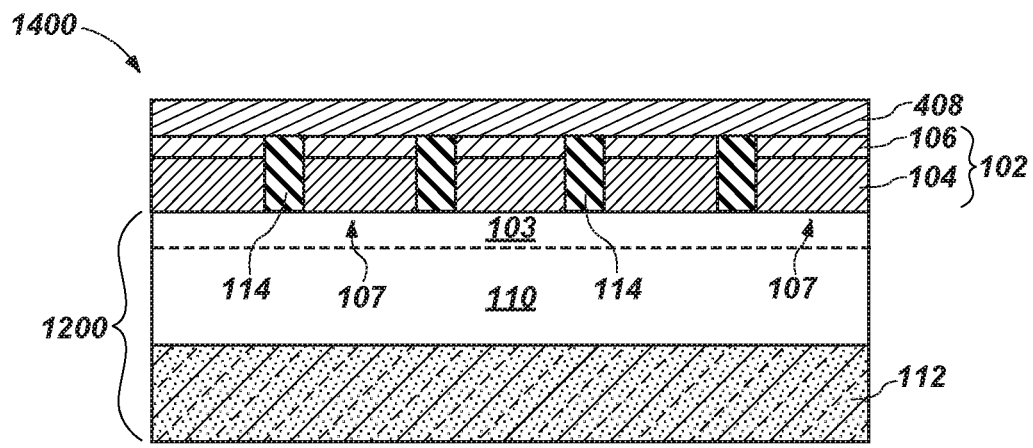
Figure 15:
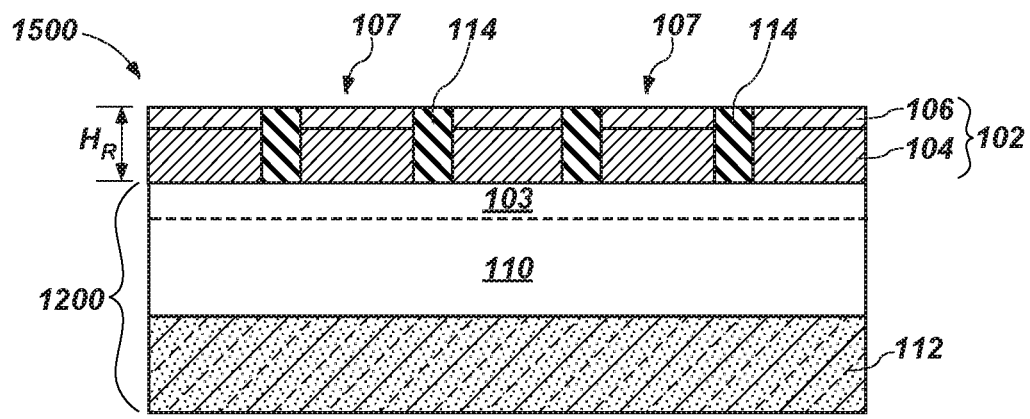

The initial support wafer 500 (whether formed by the stages illustrated in FIGS. 6 through 8, by the stages illustrated in FIGS. 9 through 11, or by some other method) may then be flipped (e.g., inverted), as indicated by arrow B in FIG. 12, and joined to a device wafer 1200 that has been separately fabricated to include the upper device region 103 and the lower device region 110 supported by the substrate 112. More particularly, a surface 501 (FIG. 12) of the initial support wafer 500 (e.g., what was an upper surface) may be brought in contact with an upper surface 1201 of the device wafer 1200, and the two surfaces 501, 1201 bonded together to form joined structure 1300 of FIG. 13. In some embodiments, the upper surface 1201 of the device wafer 1200 may include dielectric material (e.g., interdielectric material 122 (FIG. 2)) configured or formulated to have dangling bonds that will, when brought in contact with the materials of the surface 501 of the initial support wafer 500 (e.g., the passivation material 114) chemically bond thereto to affix the initial support wafer 500 to the device wafer 1200. As such, the initial support wafer 500 may be bonded to the device wafer 1200 by "dielectric bonding."

In the joined structure 1300, the conductive elements 107 of the RDL 102 include the carbon-based material 104 on (e.g., directly on) the upper surface 1201 of the device wafer 1200, and the seed material 106 above the carbon-based material 104. At this stage, the sacrificial base material 408 overlays the RDL 102 and the passivation material 114, and the sacrificial substrate 410 overlays the sacrificial base material 408.

Because the initial support wafer 500 and its carbon-based material 104 are fabricated separately from the fabrication of the device wafer 1200, the high-temperature formation processes used to form the carbon-based material 104 do not risk detrimentally impacting the materials or components of the device region (e.g., the materials and components of the upper and lower device regions 103, 110). Therefore, even graphene or another carbon-based material 104 that may require high temperatures for formation, can be used in the RDL 102 without the high-temperature formation processes damaging other materials of the semiconductor device being fabricated.

The sacrificial materials of the initial support wafer 500 may then be removed to expose the conductive elements 107 of the RDL 102 and the intervening passivation material 114. For example, the sacrificial substrate 410 may be removed (e.g., by etching (e.g., wet etching, dry etching), by grinding) to form structure 1400 of FIG. 14; and, the sacrificial base material 408 may then be removed (e.g., by etching (e.g., wet etching, dry etching), by grinding) to form structure 1500 of FIG. 15. In some embodiments, removal of the sacrificial substrate 410 and removal of the sacrificial base material 408 may be two distinct stages. In other embodiments, both the sacrificial substrate 410 and the sacrificial base material 408 may be removed together or substantially together to form structure 1500.

The other passivation material 116 (FIG. 1) may then be formed on the conductive elements 107 (e.g., on or directly on the seed material 106 of the RDL 102) and the passivation material 114 and then patterned to form the openings 118 (FIG. 1), to form the semiconductor device package 100 of FIG. 1.

Accordingly, disclosed is a method for fabricating a semiconductor device package. The method comprises forming a carbon-based material on a sacrificial substrate. The method also includes inverting the sacrificial substrate and bonding the sacrificial substrate to another wafer comprising semiconductor device components. After the bonding, the sacrificial substrate is removed to leave the carbon-based material over the other wafer.

Figure 16:
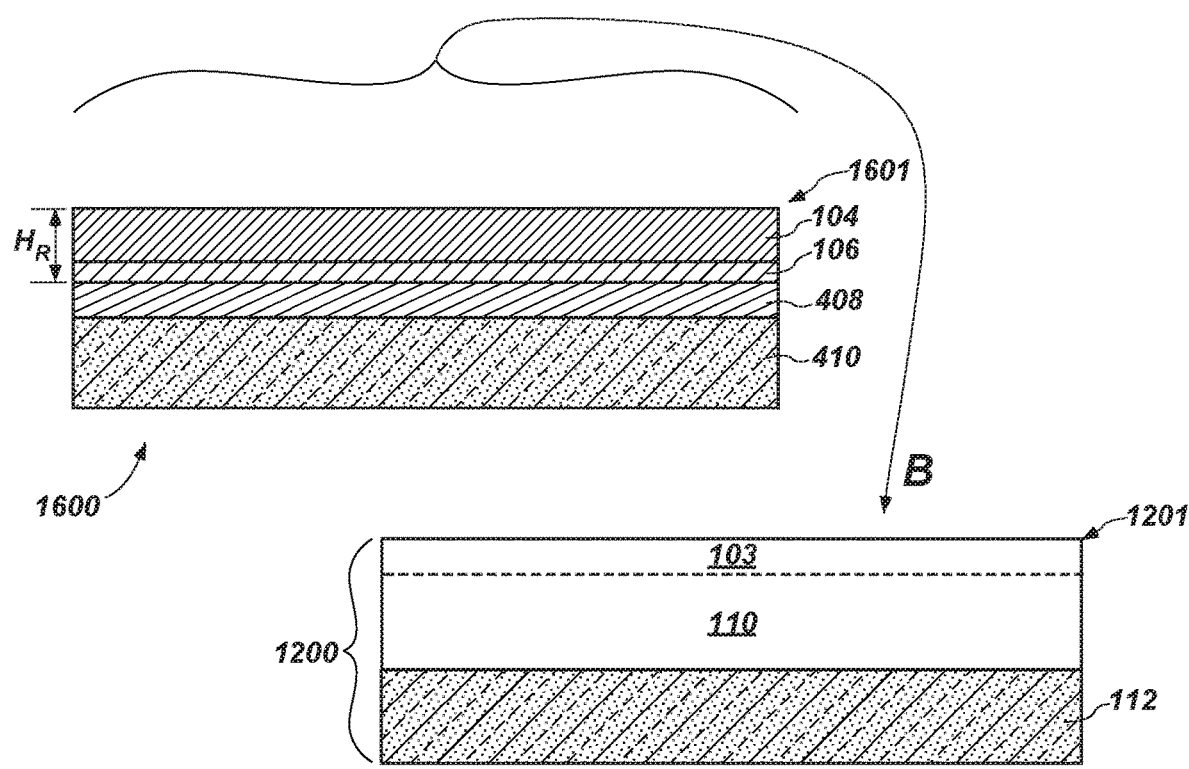
Figure 17:
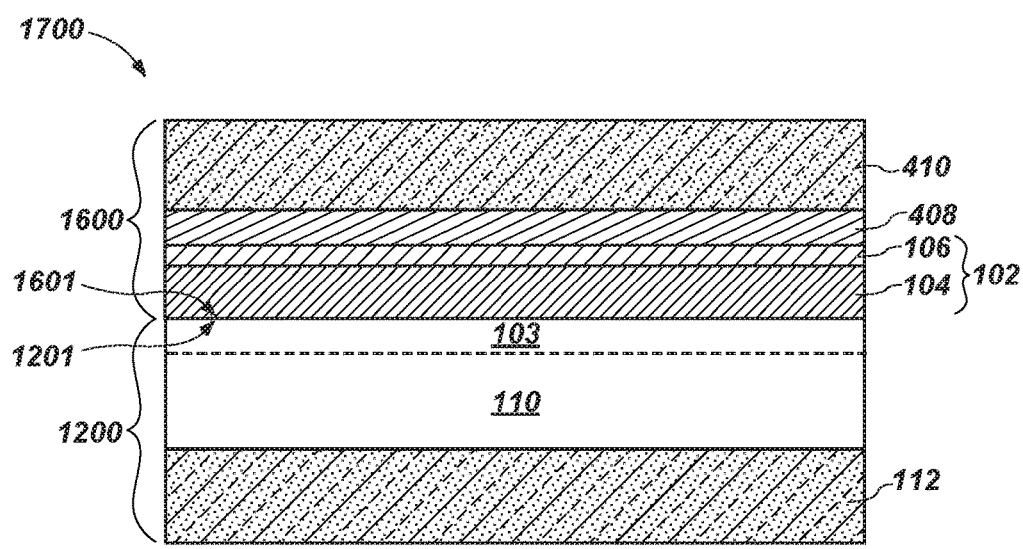

In some embodiments, the conductive elements 107 with intervening passivation material 114 may not be formed until after an initial support wafer is flipped and joined to the device wafer 1200. For example, with reference to FIG. 16, an initial support wafer 1600 may be fabricated by forming the seed material 106 over the sacrificial base material 408 and forming the carbon-based material 104 over the seed material 106. An upper surface 1601 of the initial support wafer 1600 may, therefore, be a continuous surface of the carbon-based material 104 or, in some embodiments, a dielectric material (not illustrated) formed on the carbon-based material 104. The initial support wafer 1600 may then be flipped (as indicated by arrow B) and joined to the upper surface 1201 of the device wafer 1200, forming joined structure 1700 of FIG. 17. The sacrificial substrate 410 and the sacrificial base material 408 may then be removed, as described above, to expose the seed material 106 above the carbon-based material 104, as illustrated in FIG. 18.

Figure 19:
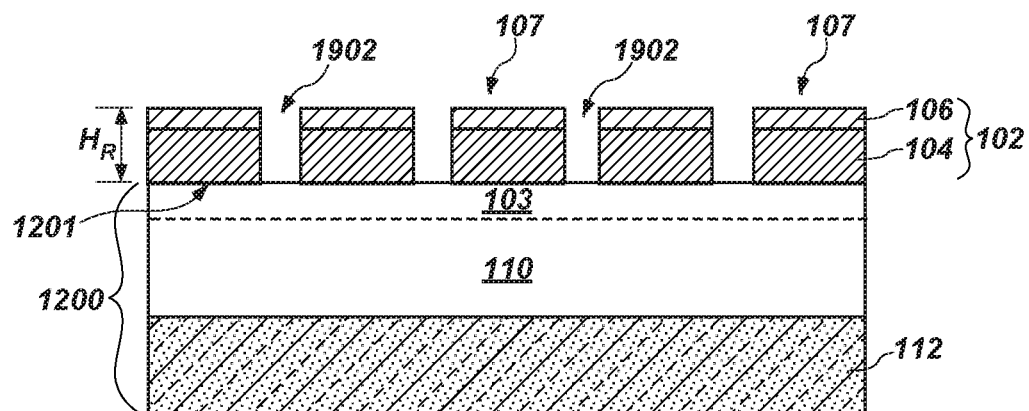
Figure 20:
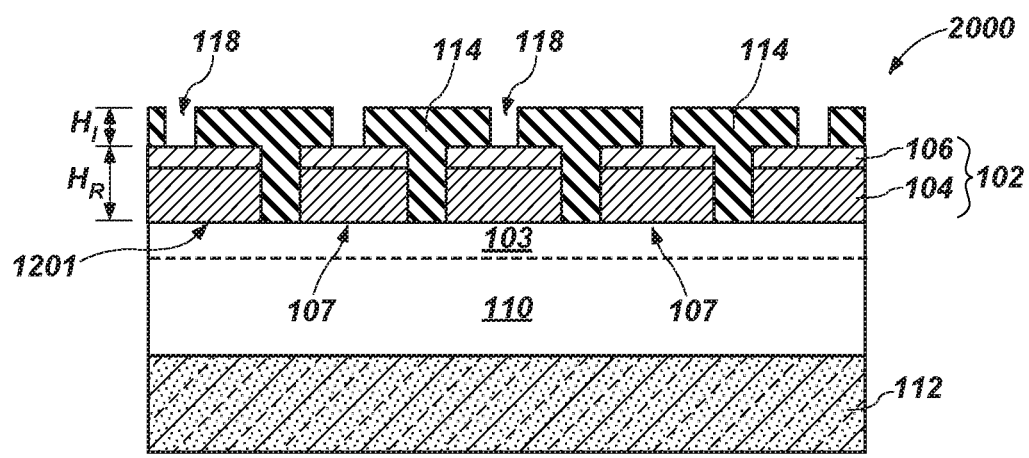

The seed material 106 and the carbon-based material 104 may then be patterned, in the same manner described above with respect to FIG. 7, by forming openings 1902 (FIG. 19) that expose areas of the upper surface 1201 of the device wafer 1200. The passivation material 114 may then be formed to fill the openings 1902 and overlay the conductive elements 107 of the RDL 102 and patterned to form the openings 118, to form semiconductor device package 2000 of FIG. 20. The semiconductor device package 2000 of FIG. 20 may be the same as that the semiconductor device package 100 of FIG. 1, except—in the semiconductor device package 2000 of FIG. 20—the passivation material 114 may be continuous both between and above the conductive elements 107, instead of—as in the semiconductor device package 100 of FIG. 1—the passivation material 114 between the conductive elements 107 being separately formed from the other passivation material 116 above the conductive elements 107. Nonetheless, in embodiments in which the passivation material 114 and the other passivation material 116 have the same composition, there may be no visual distinction between the semiconductor device packages 100, 2000.

Figure 21:
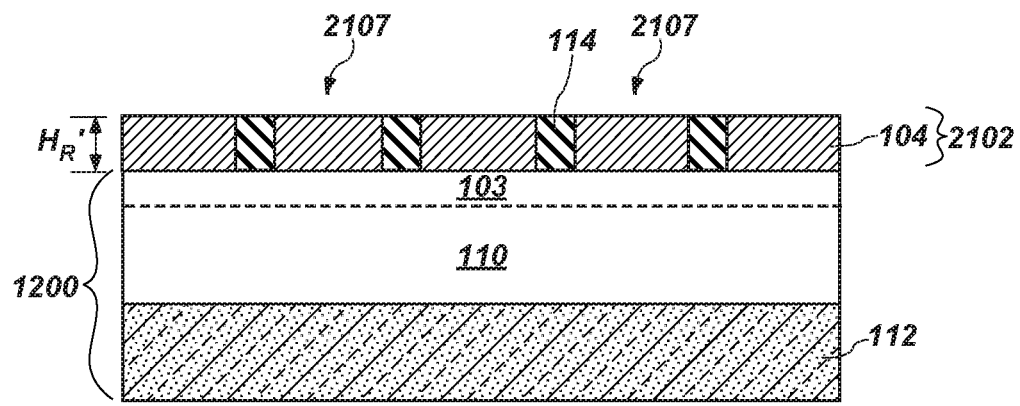
Figure 22:
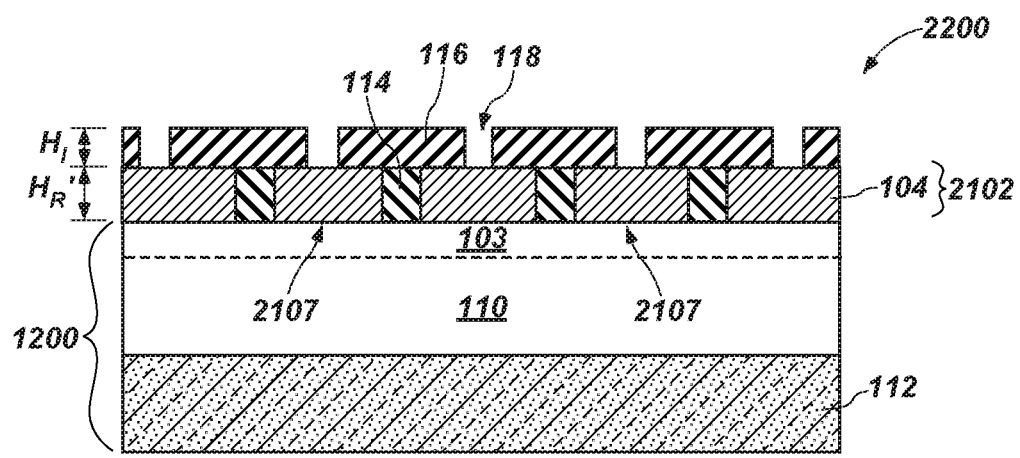

In some embodiments, some or all of the seed material 106 may be removed with or subsequent to removal of the sacrificial materials (e.g., the sacrificial substrate 410 (FIG. 13) and the sacrificial base material 408 (FIG. 14)) of the initial support wafer 500. For example, further to the method illustrated in FIGS. 4 through 15 and with returned reference to FIG. 15, the exposed seed material 106 and adjacent portions of the passivation material 114 may be removed (e.g., by CMP, by grinding, by etching) to leave only the carbon-based material 104 exposed, as illustrated in FIG. 21. Thus, conductive elements 2107 of redistribution layer 2102 may consist of the carbon-based material 104 and may define a height $H_R'$. Height $H_R'$ may be thin, at less than about 2000 Å (less than about 0.2 μm) (e.g., less than about 1000 Å (less than about 0.1 μm), less than about 500 Å (less than about 0.05 μm)). The other passivation material 116 may then be formed on (e.g., directly on) the carbon-based material 104 and the passivation material 114 to the thickness of $H_1$ and patterned to form openings 118, as illustrated in FIG. 22, forming semiconductor device package 2200 with the significant height form factor savings.

Figure 18:
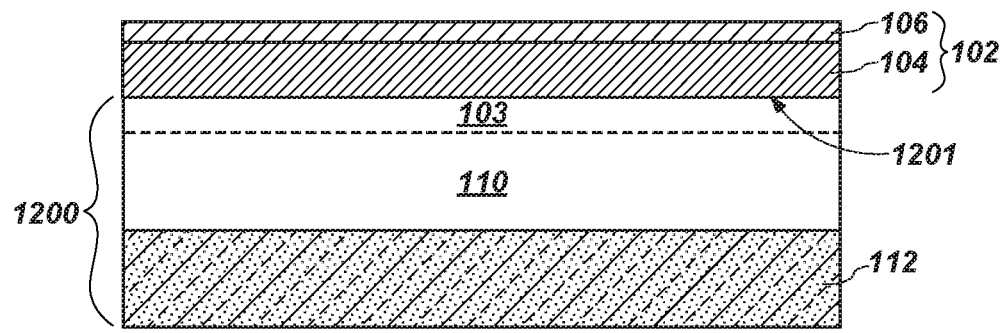
Figure 23:
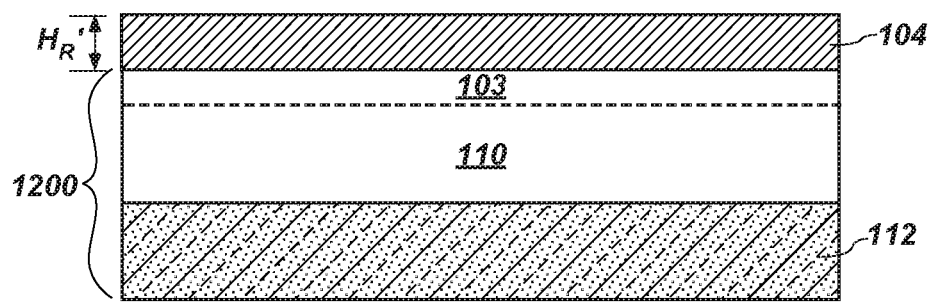
Figure 24:
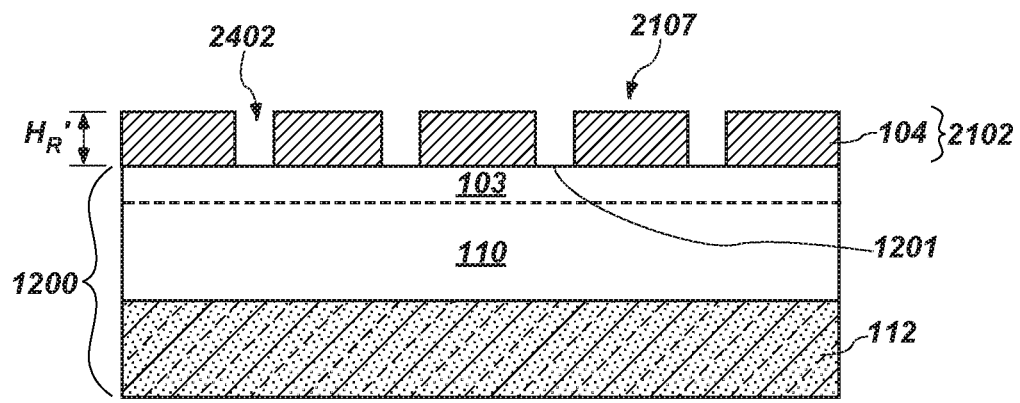
Figure 25:
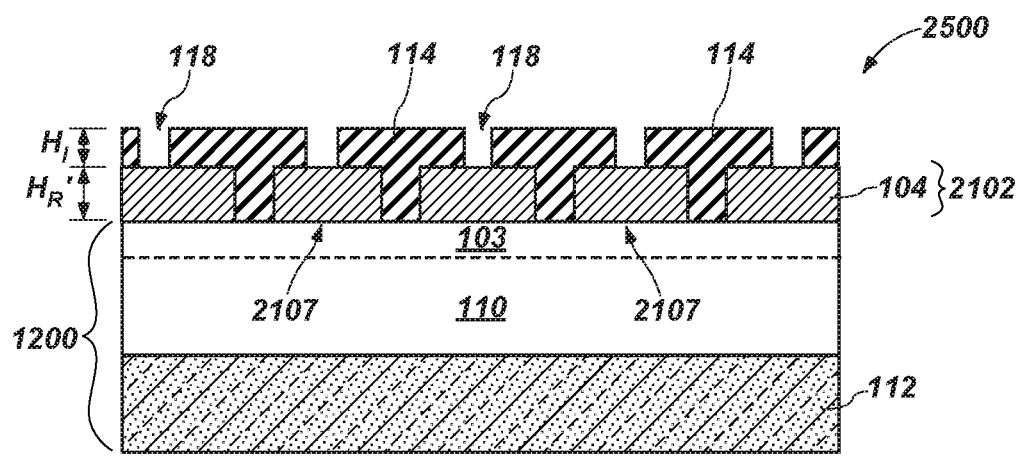

As another example, further to the method illustrated in FIGS. 4, 6, and 16 through 20, and with returned reference to FIG. 18, the seed material 106 may be removed (e.g., by CMP, by grinding, by etching) to leave the carbon-based material 104 exposed and defining the height $H_R'$, as illustrated in FIG. 23. The carbon-based material 104 may then be patterned (e.g., by photolithography and etching (e.g., dry etching, wet etching)) to form openings 2402 exposing areas of the upper surface 1201 of the device wafer 1200, as illustrated in FIG. 24. The passivation material 114 may then be formed to fill the openings 2402 and overlay the conductive elements 2107 of the RDL 2102 consisting of the carbon-based material 104. The passivation material 114 may then be patterned (e.g., by photolithography and etching) to form the openings 118. The resulting semiconductor device package 2500 (FIG. 25) may also benefit from the significant height form factor savings enabled by using the carbon-based material 104 with low resistivity and low height.

Figure 26:
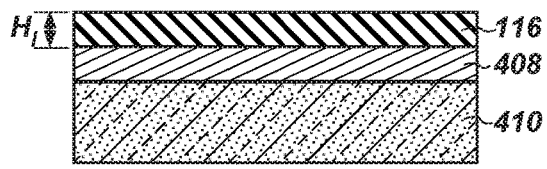
FIGS. 26 through 31 are cross-sectional, elevational, schematic illustrations during various stages of processing to fabricate a semiconductor device package according to an embodiment of the disclosure.
Figure 27:
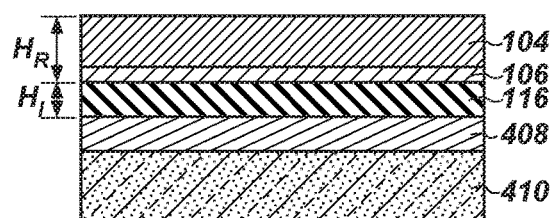
Figure 30:
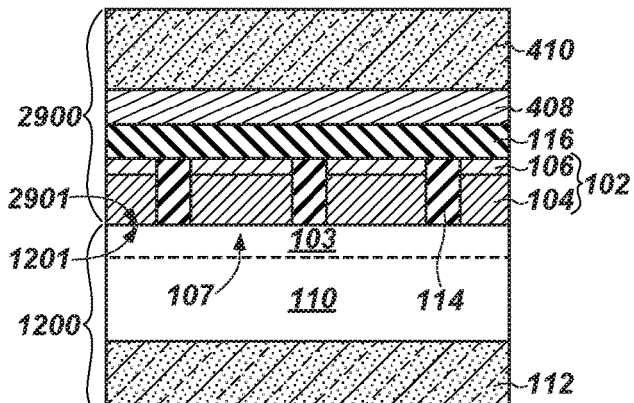
Figure 28:
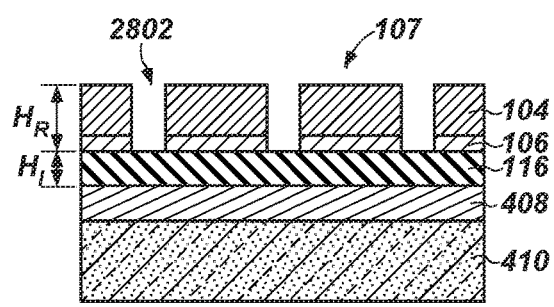
Figure 31:
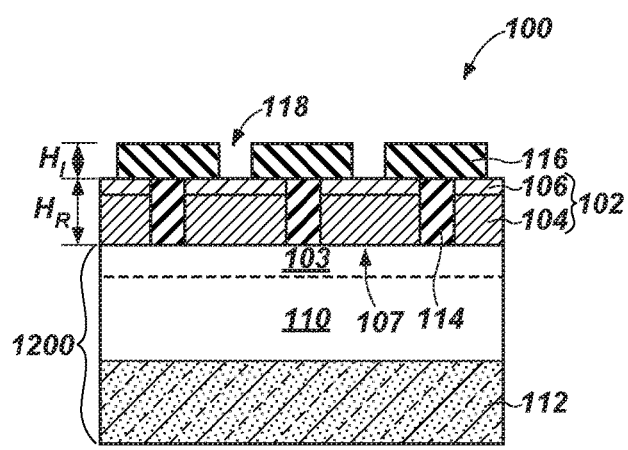
Figure 29:
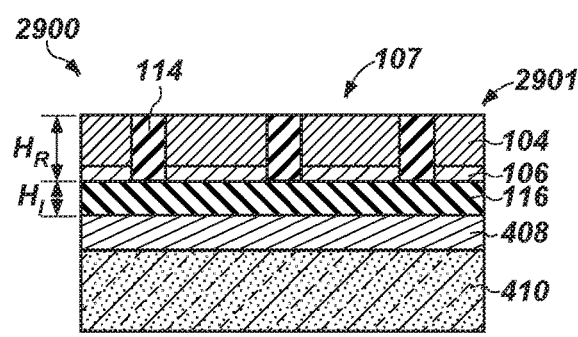

In some embodiments, the other passivation material 116, which defines the height $H_1$ above the conductive elements 107, may be formed prior to forming the conductive materials of the conductive elements 107 and prior to the flip and bonding. For example, with reference to FIG. 26, the other passivation material 116 may be on (e.g., directly on) the sacrificial base material 408, such as to form a continuous film defining the height $H_1$. The seed material 106 and the carbon-based material 104 may be formed, sequentially, on the other passivation material 116, as illustrated in FIG. 27. The seed material 106 and the carbon-based material 104 may be patterned to form openings 2802 exposing areas of the other passivation material 116, as illustrated in FIG. 28. The passivation material 114 may then be formed to at least fill the openings 2802, forming initial support wafer 2900, as illustrated in FIG. 29, with an upper surface 2901 exposing the carbon-based material 104 and the passivation material 114 between the conductive elements 107. The initial support wafer 2900 may then be inverted and joined to the device wafer 1200 with the upper surface 2901 of the initial support wafer 2900 contacting the upper surface 1201 of the device wafer 1200, as illustrated in FIG. 30. The sacrificial materials of the initial support wafer 2900 (e.g., the sacrificial substrate 410, the sacrificial base material 408) may then be removed, leaving the other passivation material 116 over the conductive elements 107 that include the carbon-based material 104, as illustrated in FIG. 31. The passivation material 116 may then be patterned to form the openings 118. The resulting structure may be equivalent or identical to the semiconductor device package 100 of FIG. 1.

Figure 32:
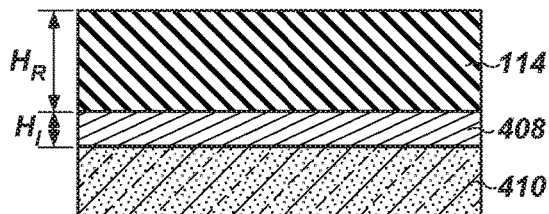
FIGS. 32 through 36 are cross-sectional, elevational, schematic illustrations during various stages of processing to fabricate a semiconductor device package according to an embodiment of the disclosure.
Figure 33:
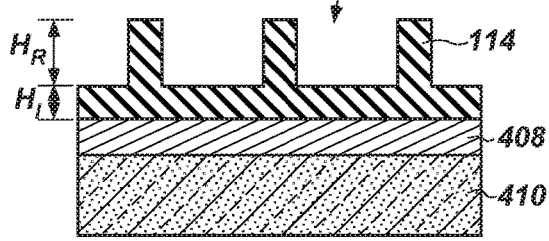
Figure 34:
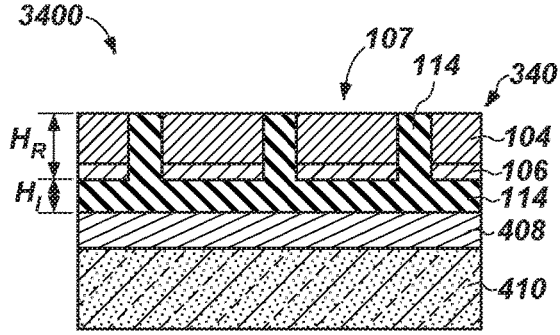
Figure 35:
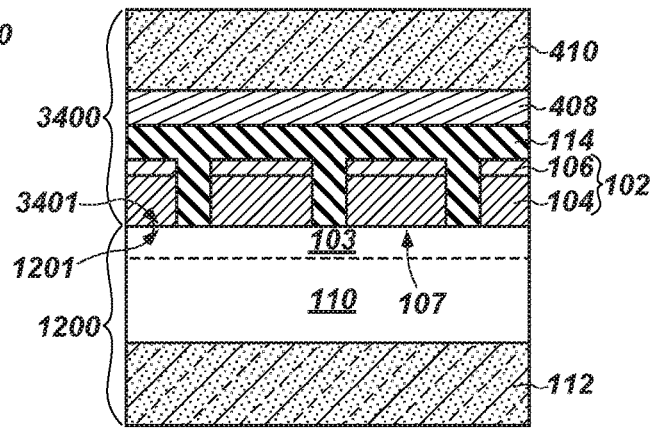
Figure 36:
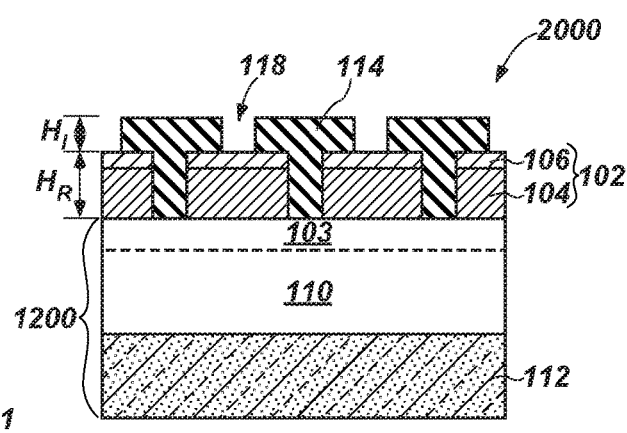

As another example, with reference to FIG. 32, the passivation material 114 may be formed over the sacrificial base material 408 to a height of $H_R+H_1$. Portions of the passivation material 114 may be removed (e.g., etched) to form openings 3302 defined wholly in the passivation material 114, as illustrated in FIG. 33. The seed material 106 and the carbon-based material 104 may be formed in the openings 3302 to form the conductive elements 107 of the RDL 102, as illustrated in FIG. 34, forming initial support wafer 3400 with a continuous region of the passivation material 114. The initial support wafer 3400 may then be inverted and joined to bond an upper surface 3401 of the initial support wafer 3400 to the upper surface 1201 of the device wafer 1200, as illustrated in FIG. 35. The sacrificial materials (e.g., the sacrificial substrate 410 and the sacrificial base material 408) may then be removed, leaving the passivation material 114 above and between the conductive elements 107, as illustrated in FIG. 36. The passivation material 114 may then be patterned to form the openings 118. The resulting structure may be equivalent or identical to the semiconductor device package 2000 of FIG. 20.

Figure 37:
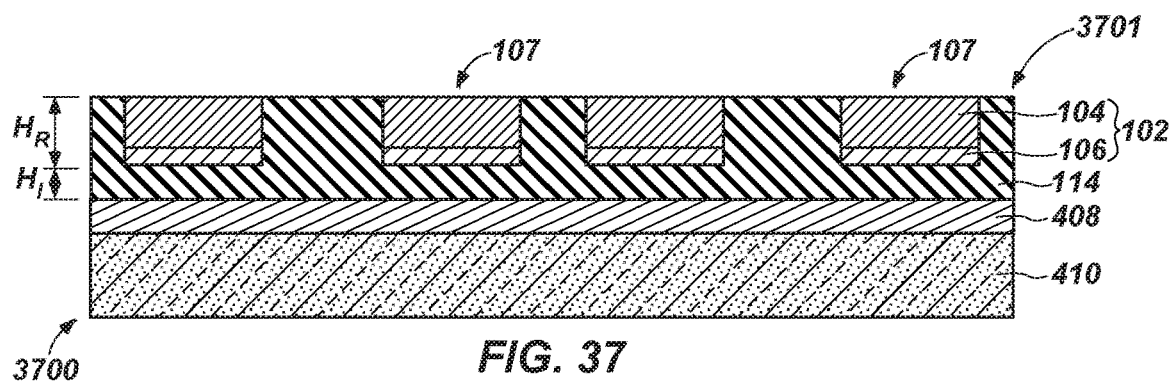
FIGS. 37 through 41 are cross-sectional, elevational, schematic illustrations during various stages of processing to fabricate the singulated semiconductor device package of FIG. 3.

The carbon-based material 104 in the RDL 102 may also be used in chip-on-wafer embodiments in which the components of a device layer (e.g., device region 310 (FIG. 3)) are constructed above the initial support wafer after forming the carbon-based material 104 but before flipping the wafer. With reference to FIG. 37, an initial support wafer 3700 may be fabricated, e.g., using the method illustrated by FIGS. 26 through 29 or using the method illustrated by FIGS. 32 through 34. The materials and components of the device region 310 (FIG. 3) may then be formed (e.g., by methods such as those described in U.S. patent application Ser. No. 15/976,398, filed May 10, 2018) over the initial support wafer 3700.

Figure 38:
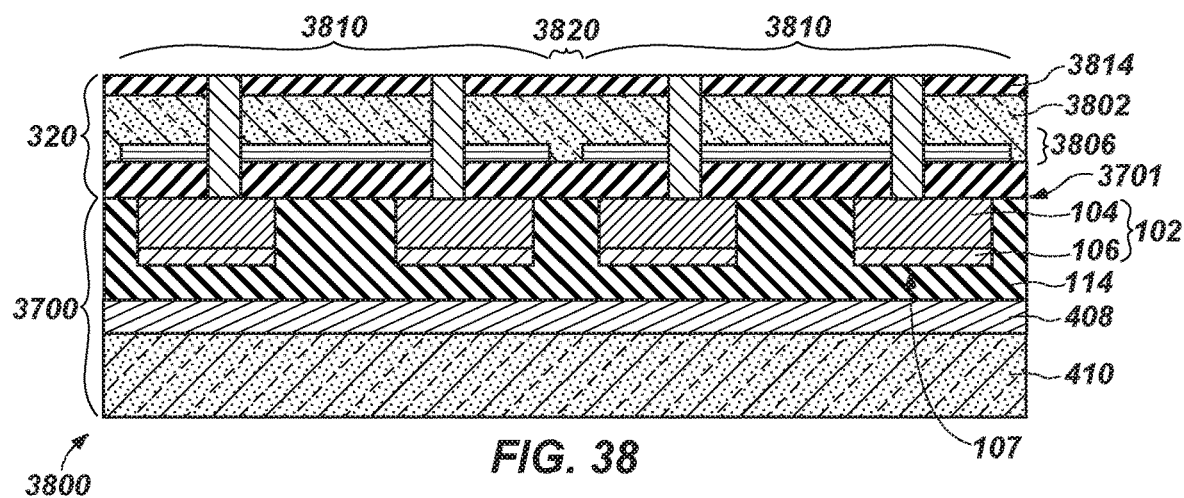

For example, the materials and components of the upper portion 320 of the device region 310 (FIG. 3) may be formed on or joined to an upper surface 3701 of the initial support wafer 3700, as illustrated in FIG. 38. In some embodiments, the upper portion 320 may be formed on another substrate 3802 (e.g., another silicon wafer), separate from the initial support wafer 3700, with such other substrate 3802 being processed to expose a portion of the via 340 (FIG. 3) through a backside dielectric material 3814 before the structure is bonded to the initial support wafer 3700. The resulting structure 3800 includes multiple die locations 3810, each with an active surface comprising active circuitry 3806 (e.g., memory circuitry in the form of DRAM circuitry or NAND flash memory circuitry). The active circuitry 3806 may later be in electrical communication with external conductive elements in the form of, e.g., copper pillars that may occupy the openings 118 (FIG. 3) communicating to the conductive elements 107. Between the die locations 3810 are scribe areas 3820, delineating so-called "streets."

Figure 39:
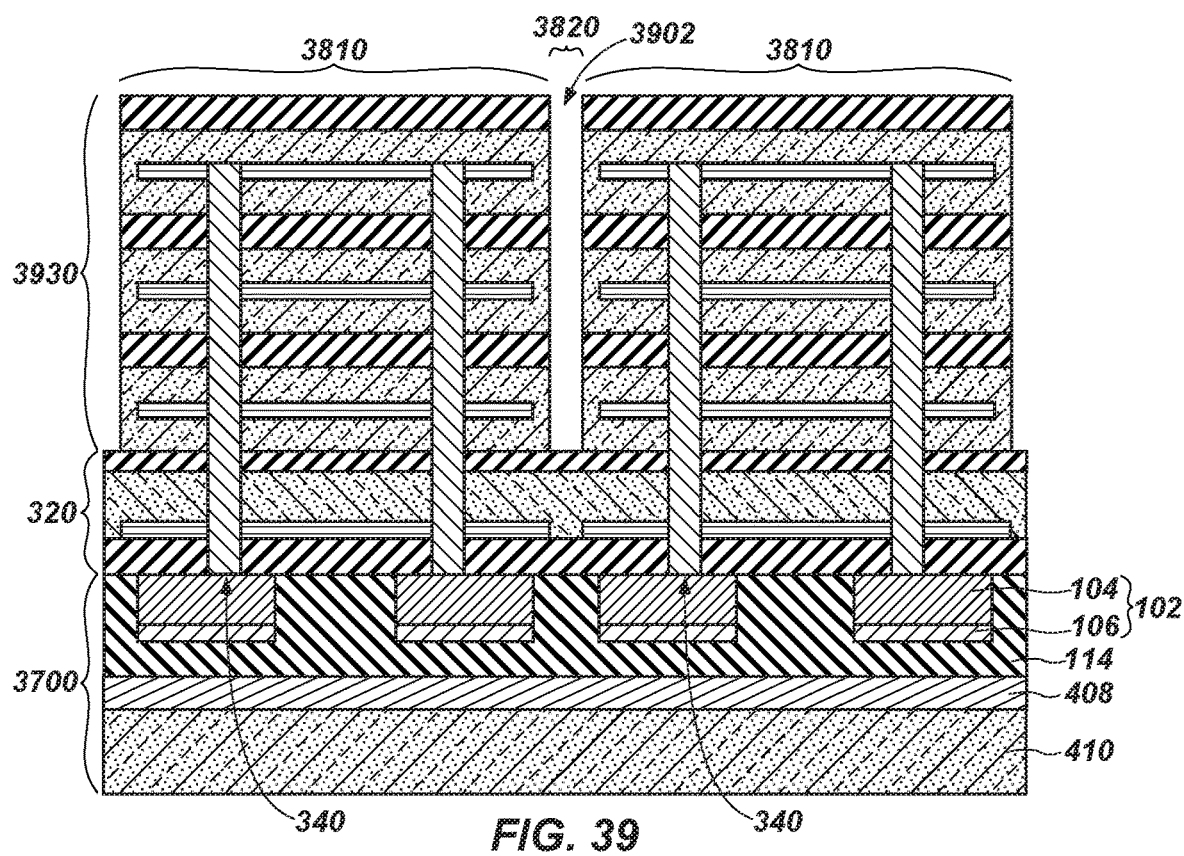
Figure 40:
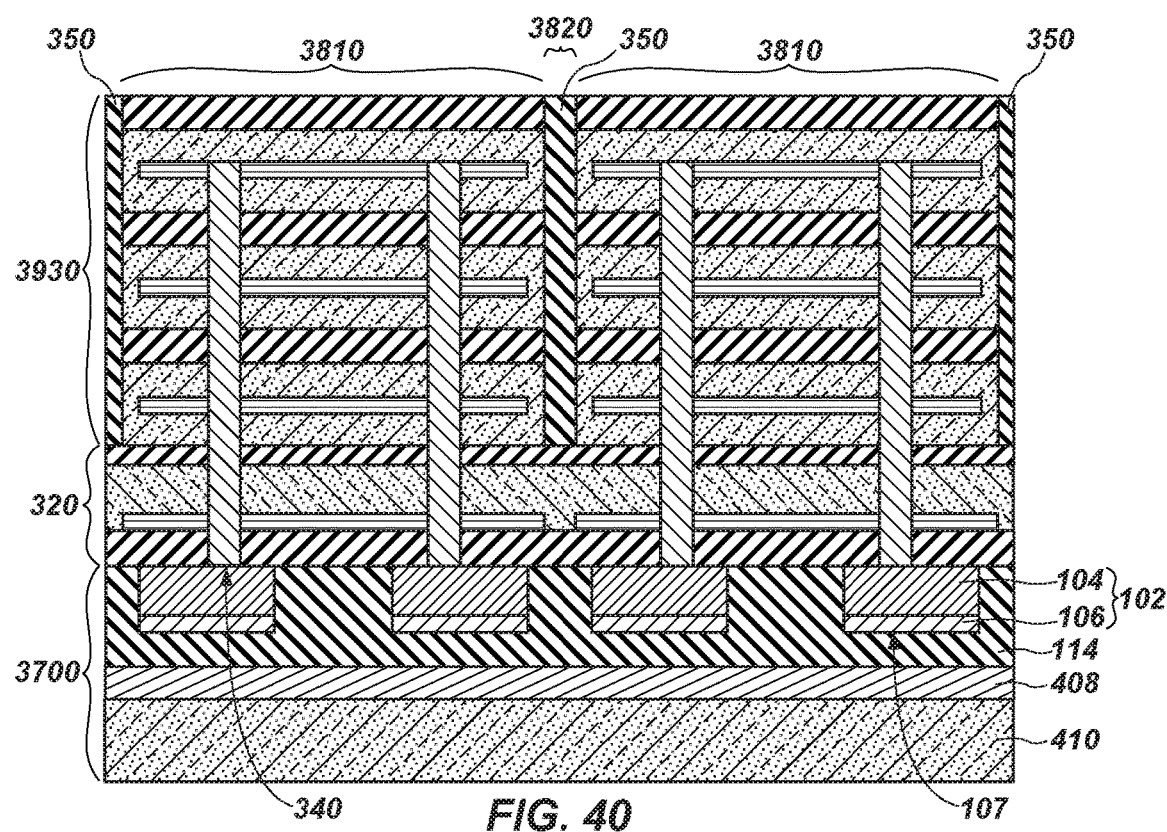
Figure 41:
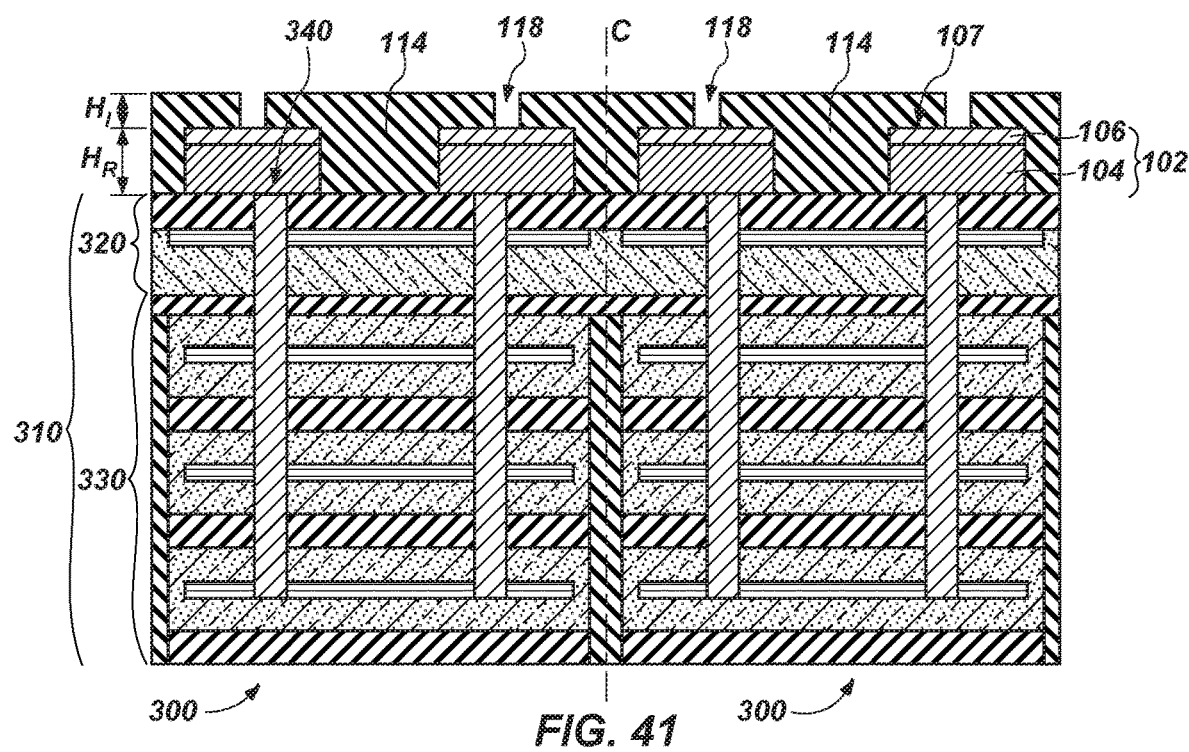

On the structure 3800 (e.g., on the backside dielectric material 3814) may be formed materials and components of another portion 3930 that will become part of the lower dice 330 (FIG. 3) of the semiconductor device package 300 (FIG. 3). The vias 340 may be formed to extend from the carbon-based material 104 in the initial support wafer 3700 to an upper die of the other portion 3930, as illustrated in FIG. 39. Openings 3902 may be formed in the scribe areas 3820, extending through the other portion 3930 to the upper portion 320. The openings 3902 may be filled with the molding compound 350, as illustrated in FIG. 40. The structure may then be inverted and the sacrificial materials (the sacrificial substrate 410 and the sacrificial base material 408) removed, as illustrated in FIG. 41. The openings 118 may be formed through the passivation material 114, and the structure may then be separated, or "singulated" at cut line C through scribe areas 3820 (FIG. 40) into individual semiconductor dice (e.g., individual, singulated semiconductor device packages 300). The singulation may be effected with a very narrow dicing saw blade width.

Notably, by the method of FIGS. 37 through 41, the high-temperature processes used to form the carbon-based material 104 do not risk detriment to the components or materials of the device region 310 because the device region 310 is formed either subsequent to forming the carbon-based material 104 or are formed separately and subsequently bonded above the already-formed carbon-based material 104.

It should be recognized that the initial support wafer 3700 portion of the structure of FIG. 40 may be otherwise formed by any of the other aforementioned methods for forming an initial support wafer. For example, initial support wafer 3700 may be first formed as the initial support wafer 500 of FIG. 5 and the upper portion of the passivation material 114 (i.e., the portion defining height $H_1$) may be formed after the sacrificial substrate 410 and the sacrificial base material 408 are removed. In addition, in some embodiments, the seed material 106 may be removed before forming such additional portion of the passivation material 114, as in the methods discussed above with respect to FIGS. 21 through 25.

Accordingly, disclosed is a method for fabricating a semiconductor device package. The method comprises forming an initial support wafer. Forming the initial support wafer comprises forming a conductive carbon-based material on a sacrificial substrate. A surface of the initial support wafer is bonded to another wafer comprising semiconductor device components. The sacrificial substrate is removed, and a passivation material is formed over the conductive carbon-based material.

Figure 42:
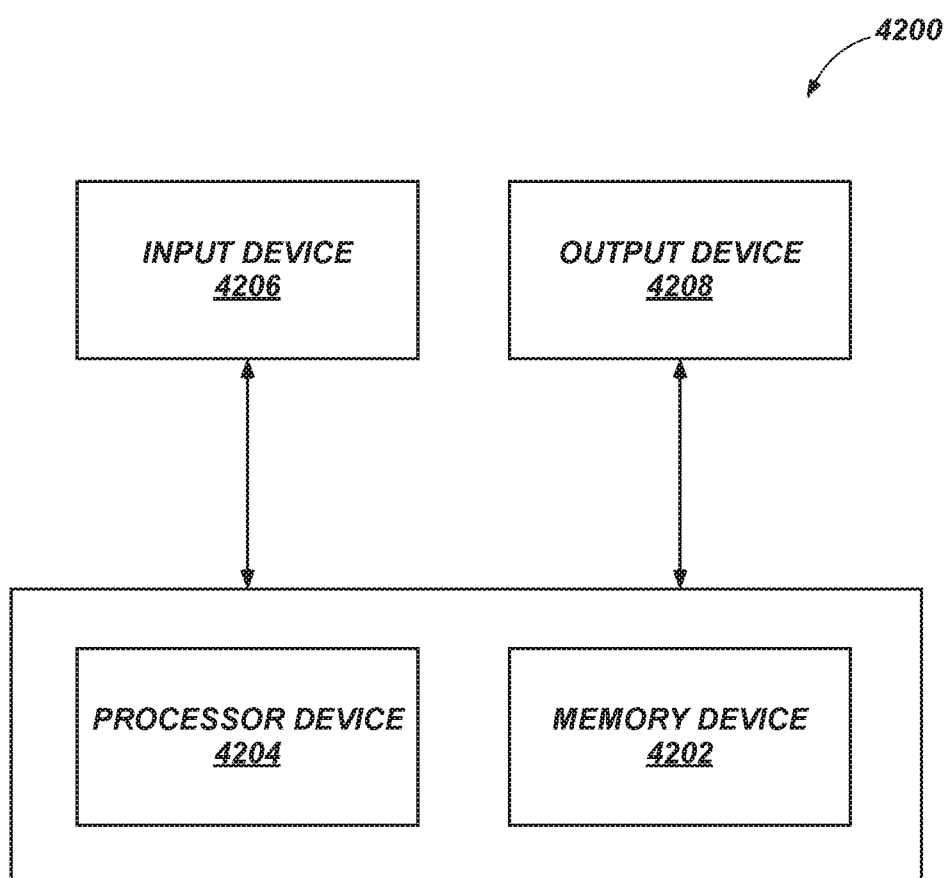
FIG. 42 is a block diagram of an electronic system including at least one semiconductor device package according to one or more embodiments of the disclosure.

Semiconductor devices (e.g., the semiconductor device packages 100 (FIG. 1), 300 (FIG. 3), 2000 (FIG. 20), 2200 (FIG. 22), 2500 (FIG. 25)), in accordance with embodiments of the disclosure, may be used in embodiments of electronic systems of the disclosure. For example, with reference to FIG. 42, shown is a block diagram of an illustrative electronic system 4200, according to embodiments of the disclosure. The electronic system 4200 may comprise, for example, a computer or computer hardware component, a server or other networking hardware component, a cellular telephone, a digital camera, a personal digital assistant (PDA), a portable media (e.g., music) player, a Wi-Fi- or cellular-enabled tablet (e.g., an IPAD® or SURFACE® tablet, an electronic book, an electronic reader, a navigation device). The electronic system 4200 includes at least one memory device 4202. The memory device 4202 may include, for example, an embodiment of a semiconductor device package (e.g., the semiconductor device packages 100 (FIG. 1), 300 (FIG. 3), 2000 (FIG. 20), 2200 (FIG. 22), 2500 (FIG. 25)) described herein. Such memory device may, optionally, include dice configured for other functions (e.g., a logic die, an RF die, or both). The electronic system 4200 may further include at least one electronic signal processor device 4204 (often referred to as a "microprocessor"). The electronic system 4200 may further include one or more input devices 4206 for inputting information into the electronic system 4200 by a user, e.g., using a mouse or other pointing device, a keyboard, a touchpad, a button, or a control panel. The electronic system 4200 may further include one or more output devices 4208 for outputting information (e.g., visual or audio output) to a user by, e.g., a monitor, a display, a printer, an audio output jack, a speaker, etc. In some embodiments, the input device 4206 and the output device 4208 may comprise a single touchscreen device that can be used both to input information to the electronic system 4200 and to output visual information to a user. The input device 4206 and the output device 4208 may communicate electrically with one or more of the memory devices 4202 and the electronic signal processor device 4204. It is also contemplated that, in lieu of separate memory and signal processor devices 4202 and 4204, a single assembly may be configured as a system (e.g., the electronic system 4200) in a package including a processor and/or other die functionalities.

Accordingly, disclosed is an electronic system comprising at least one input device, at least one output device, and a processor device operably coupled to the at least one input device and to the at least one output device. The electronic system also comprises a semiconductor device that comprises at least one memory die, a redistribution layer, and a passivation material. The redistribution layer comprises conductive elements of a conductive carbon-based material. The conductive elements define a height of less than about 0.2 μm and are electrically connected to the at least one memory die. The passivation material electrically isolates the conductive elements of the redistribution layer and also defines a height of less than about 0.2 μm.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with or substituted for features of another disclosed embodiment while still being encompassed within the scope of the disclosure.

What is claimed is:

1. A method for fabricating a semiconductor device package, the method comprising:
   forming a conductive carbon-based material on a sacrificial substrate;
   inverting the sacrificial substrate;
   bonding the sacrificial substrate to a wafer comprising a device region comprising semiconductor device components, after the bonding the device region being directly adjacent the conductive carbon-based material; and
   after the bonding, removing the sacrificial substrate to leave a redistribution layer comprising conductive elements comprising the conductive carbon-based material over the wafer, the conductive carbon-based material defining a vertical height, between a lower surface and an upper surface of the conductive carbon-based material, of less than about 0.2 μm;
   forming a passivation material laterally between and partially overlapping the upper surface of the conductive elements, the passivation material defining openings extending therethrough to the conductive elements,
   whereby the lower surface of the conductive carbon-based material of at least one of the conductive elements is directly above:
      a conductive structure of the device region, and
      a dielectric material of the device region,
      the conductive carbon-based material of the at least one of the conductive elements extending horizontally beyond sidewalls of the conductive structure of the device region, and
   whereby, in the redistribution layer, the conductive elements are horizontally spaced apart from one another by a distance of less than one micrometer by portions of the passivation material each having a width of the distance of less than one micrometer.

2. The method of claim 1, wherein forming the passivation material laterally between and partially overlapping the upper surface of the conductive elements comprises forming the passivation material to define with the conductive carbon-based material a height of less than about 0.2 μm.

3. The method of claim 1, further comprising, before forming the conductive carbon-based material on the sacrificial substrate:
   forming a sacrificial base material directly on the sacrificial substrate, the sacrificial base material comprising another dielectric material; and forming a seed material directly on the sacrificial base material,
wherein forming the conductive carbon-based material on the sacrificial substrate comprises forming the carbon-based material directly on the seed material.

4. The method of claim 3, further comprising, after removing the sacrificial substrate, removing the seed material.

5. The method of claim 4, further comprising, after removing the seed material, patterning the conductive carbon-based material to define the conductive elements as discrete structures.

6. The method of claim 3, further comprising, after removing the sacrificial substrate, patterning the conductive carbon-based material and the seed material to define the conductive elements as discrete structures spaced by additional openings.

7. The method of claim 1, further comprising:
patterning the conductive carbon-based material to form the conductive elements as discrete structures defining additional openings between the discrete structures; and
wherein forming the passivation material laterally between and partially overlapping the upper surface of the conductive elements comprises filling the additional openings with the passivation material.

8. The method of claim 7, wherein patterning the conductive carbon-based material precedes inverting the sacrificial substrate.

9. The method of claim 7, wherein patterning the conductive carbon-based material follows inverting the sacrificial substrate.

10. The method of claim 1, wherein:
forming the passivation material laterally between the conductive elements comprises, before forming the conductive carbon-based material on the sacrificial substrate:
forming the passivation material on the sacrificial substrate; and
patterning the passivation material to define additional openings; and
forming the conductive carbon-based material on the sacrificial substrate comprises
forming the conductive carbon-based material in the additional openings defined in the passivation material.

11. The method of claim 10, wherein forming the passivation material partially overlapping the upper surface of the conductive elements comprises, after removing the sacrificial substrate, forming another region of the passivation material over the conductive carbon-based material.

12. A method for fabricating a semiconductor device package, the method comprising:
forming an initial support wafer comprising:
forming a conductive carbon-based material on a sacrificial substrate;
bonding a surface of the initial support wafer to another wafer comprising semiconductor device components of a device region, the device region being directly adjacent the conductive carbon-based material;
removing the sacrificial substrate; and
patterning the conductive carbon-based material into conductive elements of a redistribution layer, the redistribution layer comprising the conductive elements comprising the conductive carbon-based material defining a vertical height, between a lower surface and an upper surface of the conductive carbon-based material, of less than about 0.2 μm;
forming a passivation material laterally between and partially overlapping the upper surface of the conductive elements, the passivation material defining openings extending therethrough to the conductive elements,
whereby the lower surface of the conductive carbon-based material of at least one of the conductive elements is directly above:
a conductive structure of the device region, and
a dielectric material of the device region,
the conductive carbon-based material of the at least one of the conductive elements extending horizontally beyond sidewalls of the conductive structure of the device region, and
whereby, in the redistribution layer, the conductive elements are horizontally spaced apart from one another by a distance of less than one micrometer by portions of the passivation material each having a width of the distance of less than one micrometer.

13. The method of claim 12, wherein forming a conductive carbon-based material on a sacrificial substrate comprises forming graphene on a dielectric material on a semiconductor substrate.

14. The method of claim 12, wherein forming a conductive carbon-based material comprises forming the conductive carbon-based material at a temperature of at least 550° C. without exposing the other wafer comprising the semiconductor device components to the temperatures.

15. A device package, comprising:
a redistribution layer comprising conductive elements comprising a conductive carbon-based material defining a vertical height, between a lower surface and an upper surface of the conductive carbon-based material, of less than about 0.2 μm;
passivation material laterally between and partially overlapping the upper surface of the conductive elements, the passivation material defining openings extending therethrough to the conductive elements; and
a device region directly adjacent the conductive carbon-based material of the conductive elements of the redistribution layer,
wherein the lower surface of the conductive carbon-based material of at least one of the conductive elements is directly above:
a conductive structure of the device region, and
a dielectric material of the device region,
the conductive carbon-based material of the at least one of the conductive elements extending horizontally beyond sidewalls of the conductive structure of the device region, and
wherein, in the redistribution layer, the conductive elements are horizontally spaced apart from one another by a distance of less than one micrometer by portions of the passivation material each having a width of the distance of less than one micrometer.

16. The device package of claim 15, wherein the passivation material, partially overlapping the upper surface of the conductive elements, is directly adjacent the conductive carbon-based material of the conductive elements.

17. The device package of claim 15, wherein the conductive structure of the device region comprises a via extending from the lower surface of the conductive carbon-based material and through circuitry of the device region.

18. The device package of claim 15, wherein the conductive carbon-based material comprises at least one graphene, carbon nanotubes, carbon nanobuds, or carbon nanoribbons.

19. The device package of claim 15, wherein at least a portion of the lower surface of the conductive carbon-based material is directly adjacent an upper surface of the dielectric material of the device region.

20. The device package of claim 15, wherein the vertical height defined by the conductive carbon-based material is less than about 0.1 μm.

* * * * *

UNITED STATES PATENT AND TRADEMARK OFFICE
CERTIFICATE OF CORRECTION

PATENT NO. : 11,749,608 B2
APPLICATION NO. : 17/076602
DATED : September 5, 2023
INVENTOR(S) : Eiichi Nakano It is certified that error appears in the above-identified patent and that said Letters Patent is hereby corrected as shown below:

In the Specification

| | | |
|---|---|---|
| Column 3, | Line 21, | change "(e.g. (e.g., a single" to "(e.g., a single-- |
| Column 3, | Line 27, | change "50 at. % carbon," to --50 at.% carbon,-- |
| Column 7, | Line 43, | change "height $H_1$) and" to --height $H_I$) and-- |
| Column 7, | Line 45, | change "height $H_1$ of" to "height $H_I$ of" |
| Column 7, | Line 51, | change "$H_1$ of the" to "$H_I$ of the-- |
| Column 8, | Line 27, | change "height $H_1$ above" to --height $H_I$ above-- |
| Column 9, | Line 46, | change "dioxide ($SO_2$)," to --dioxide ($SiO_2$),-- |
| Column 12, | Line 61, | change "of $H_1$ and" to --of $H_I$ and-- |
| Column 13, | Line 18, | change "height $H_1$ above" to --height $H_I$ above-- |
| Column 13, | Line 24, | change "height $H_1$. The" to --height $H_I$. The-- |
| Column 13, | Line 49, | change "of $H_R+H_I$. Portions" to --of $H_R + H_I$. Portions-- |
| Column 14, | Line 67, | change "height $H_1$) may" to --height $H_I$) may-- |

In the Claims

| | | | |
|---|---|---|---|
| Claim 10, | Column 17, | Line 44-45, | change: "sacrificial substrate comprises forming the" to --sacrificial substrate comprises forming the-- |

Signed and Sealed this
Nineteenth Day of March, 2024

Katherine Kelly Vidal
*Director of the United States Patent and Trademark Office*